United States Patent
Kubo et al.

(10) Patent No.: US 11,300,719 B2
(45) Date of Patent: Apr. 12, 2022

(54) LIGHT-ABSORBING COMPOSITION AND OPTICAL FILTER

(71) Applicant: Nippon Sheet Glass Company, Limited, Tokyo (JP)

(72) Inventors: Yuichiro Kubo, Tokyo (JP); Katsuhide Shimmo, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 384 days.

(21) Appl. No.: 16/349,527

(22) PCT Filed: Nov. 13, 2017

(86) PCT No.: PCT/JP2017/040819
§ 371 (c)(1),
(2) Date: May 13, 2019

(87) PCT Pub. No.: WO2018/088561
PCT Pub. Date: May 17, 2018

(65) Prior Publication Data
US 2019/0346601 A1    Nov. 14, 2019

(30) Foreign Application Priority Data

Nov. 14, 2016 (JP) .............................. JP2016-221950

(51) Int. Cl.
*G02B 5/22* (2006.01)
*C07F 9/38* (2006.01)
(Continued)

(52) U.S. Cl.
CPC ................ *G02B 5/223* (2013.01); *C07F 9/02* (2013.01); *C07F 9/28* (2013.01); *C07F 9/3834* (2013.01);
(Continued)

(58) Field of Classification Search
CPC ........ G02B 5/223; G02B 5/208; G02B 5/282; G03F 7/0007; C07F 9/28; C07F 9/02;
(Continued)

(56) References Cited

U.S. PATENT DOCUMENTS

2010/0179348 A1    7/2010 Lee et al.
2011/0028587 A1    2/2011 Taguchi
(Continued)

FOREIGN PATENT DOCUMENTS

CN    101511779    8/2009
CN    103323897    9/2013
(Continued)

OTHER PUBLICATIONS

International Search Report issued for International Patent Application No. PCT/JP2017/040819, 5 pages including English translation.

*Primary Examiner* — Jade R Chwasz
(74) *Attorney, Agent, or Firm* — Hamre, Schumann, Mueller & Larson, P.C.

(57) ABSTRACT

A light-absorbing composition includes: a light absorber formed by a phosphonic acid represented by the following formula (a) and copper ion, the light absorber being dispersed in the light-absorbing composition; a phosphoric acid ester allowing the light absorber to be dispersed; and a curable resin. When the light-absorbing composition is applied and cured on one principal surface of a transparent dielectric substrate to form a laminate consisting of a light-absorbing layer being a cured product of the light-absorbing composition and the transparent dielectric substrate, the laminate satisfies predetermined requirements.

(Continued)

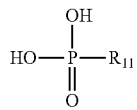

(a)

9 Claims, 8 Drawing Sheets

(51) Int. Cl.
*G02B 5/20* (2006.01)
*G03F 7/00* (2006.01)
*C07F 9/28* (2006.01)
*C07F 9/02* (2006.01)
*H01L 27/146* (2006.01)

(52) U.S. Cl.
CPC ........... *G02B 5/208* (2013.01); *G03F 7/0007* (2013.01); *H01L 27/146* (2013.01)

(58) Field of Classification Search
CPC ...... C07F 9/3834; C07F 9/091; C07F 9/3808; H01L 27/146; H01L 27/14625
USPC ............................................................ 430/7
See application file for complete search history.

(56) References Cited

U.S. PATENT DOCUMENTS

| | | | |
|---|---|---|---|
| 2018/0275326 | A1 | 9/2018 | Kubo et al. |
| 2020/0386928 | A1* | 12/2020 | Takagi ................... G02B 5/208 |
| 2020/0392343 | A1* | 12/2020 | Mizuno ................... G03F 7/105 |
| 2021/0032276 | A1* | 2/2021 | Itamoto ................... C07F 9/091 |

FOREIGN PATENT DOCUMENTS

| | | |
|---|---|---|
| JP | 2002006101 | 1/2002 |
| JP | 2005338395 | 12/2005 |
| JP | 2011203467 | 10/2011 |
| JP | 2012103340 | 5/2012 |
| JP | 6087464 | 3/2017 |
| TW | 200948886 | 12/2009 |
| WO | 2017183671 | 10/2017 |

* cited by examiner

LIGHT-ABSORBING COMPOSITION AND OPTICAL FILTER

TECHNICAL FIELD

The present invention relates to a light-absorbing composition and an optical filter.

BACKGROUND ART

In imaging apparatuses employing an imaging sensor such as a charge coupled device (CCD) or a complementary metal oxide semiconductor (CMOS), any of various optical filters is disposed ahead of the imaging sensor in order to obtain an image with good color reproduction. Imaging sensors generally have spectral sensitivity over a wide wavelength range from the ultraviolet to infrared regions. The visual sensitivity of humans lies solely in the visible region. Thus, a technique is known in which an optical filter shielding against infrared light is disposed ahead of an imaging sensor in an imaging apparatus in order to allow the spectral sensitivity of the imaging sensor to approximate to the visual sensitivity of humans.

For example, Patent Literature 1 describes a near-infrared cut filter including a norbornene resin substrate and a near-infrared-reflecting film. The near-infrared-reflecting film is made of a dielectric multilayer film. The norbornene resin substrate contains a near-infrared absorber.

Patent Literature 2 describes a near-infrared cut filter including a laminated sheet having a resin layer provided on at least one side of a glass substrate, the near-infrared cut filter satisfying predetermined requirements as to transmittance. The resin layer contains a near-infrared absorber. The near-infrared cut filter preferably has a dielectric multilayer film provided on at least one side of the laminated sheet.

Patent Literature 3 describes a near-infrared cut filter formed of a near-infrared absorber and a resin. The near-infrared absorber is obtained from a particular phosphonic acid compound, a particular phosphoric acid ester compound, and a copper salt. The particular phosphonic acid compound has a monovalent group $R^1$ bonded to a phosphorus atom P and represented by $-CH_2CH_2-R^{11}$. $R^{11}$ represents a hydrogen atom, an alkyl group having 1 to 20 carbon atoms, or a fluorinated alkyl group having 1 to 20 carbon atoms.

CITATION LIST

Patent Literature

Patent Literature 1: JP 2005-338395 A
Patent Literature 2: JP 2012-103340 A
Patent Literature 3: JP 2011-203467 A

SUMMARY OF INVENTION

Technical Problem

In the techniques described in Patent Literatures 1 and 2, the near-infrared cut filters need to have a dielectric multilayer film capable of reflecting or absorbing near-infrared light in order for the near-infrared cut filters to have desired properties. All the near-infrared cut filters described in examples of Patent Literature 2 have a dielectric multilayer film formed of alternating silica ($SiO_2$) and titania ($TiO_2$) layers. Thus, the techniques described in Patent Literatures 1 and 2 require an apparatus such as a vacuum deposition apparatus for production of the near-infrared cut filters and tend to involve complicated production steps.

A dielectric multilayer film has the property of changing the transmittance spectrum of an optical filter according to varying incident angles of incident light. In particular, such a dielectric multilayer film causes the transmittance spectrum of an optical filter to be shifted to the shorter-wavelength side with increasing incident angle. Thus, with the use of the near-infrared cut filter of Patent Literature 1 in combination with an imaging sensor of an imaging apparatus, an image obtained by the imaging apparatus may have a difference in color between the central portion of the image and the edge portion of the image because of the different angles of light incident on the optical filter. The term "transmittance spectrum" as used herein refers to one in which the transmittance (units: %) of light incident on an optical filter or on a part or combination of a substrate and functional film (functional layer) constituting the optical filter is represented as a function of wavelength.

Although the near-infrared cut filter described in Patent Literature 2 has a dielectric multilayer film, the resin layer contains a near-infrared absorber. This reduces the incident angle dependence of the transmittance spectrum. However, Patent Literature 2 fails to clarify how the dielectric multilayer film and resin layer influence the transmittance spectrum of the near-infrared cut filter, and leaves room for improvement in terms of the incident angle dependence of the absorption wavelength.

The near-infrared cut filter described in Patent Literature 3 does not need to have any dielectric multilayer film and is thought to show little shift of transmittance spectrum to the shorter-wavelength side with increasing incident angle of light. This infrared cut filter is advantageous for absorbing and cutting off infrared light in a relatively wide wavelength range. However, the wavelength range corresponding to the transmission region of this infrared cut filter is wide, and thus this infrared cut filter may permit transmission of infrared light of certain wavelengths or ultraviolet light of certain wavelengths and offer optical properties deviating from the visual sensitivity of humans. The "transmission region" refers to the wavelength range where the transmittance spectrum shows a transmittance of 70% or more.

In view of the above circumstances, the present invention provides a light-absorbing composition for an optical filter having properties advantageous for allowing the spectral sensitivity of an imaging sensor to approximate to the visual sensitivity of humans, the optical filter being capable of achieving the desired properties with a simple configuration without the need for complicated steps. The present invention also provides an optical filter produced using this light-absorbing composition.

Solution to Problem

The present invention provides a light-absorbing composition including:
 a light absorber formed by a phosphonic acid represented by the following formula (a) and copper ion, the light absorber being dispersed in the light-absorbing composition:

(a)

wherein $R_{11}$ is a phenyl group or a halogenated phenyl group in which at least one hydrogen atom of a phenyl group is substituted by a halogen atom;
   a phosphoric acid ester allowing the light absorber to be dispersed; and
   a curable resin, wherein
   when the light-absorbing composition is applied and cured on one principal surface of a transparent dielectric substrate to form a laminate consisting of a light-absorbing layer being a cured product of the light-absorbing composition and the transparent dielectric substrate, the laminate satisfies the following requirements (i) to (v):
   (i) the laminate has an average spectral transmittance of 80% or more in a wavelength range of 450 nm to 600 nm;
   (ii) the laminate has a spectral transmittance of 1% or less in a wavelength range of 750 nm to 900 nm;
   (iii) the laminate has an average spectral transmittance of 4% or less in a wavelength range of 350 nm to 370 nm;
   (iv) the laminate has a decreasing spectral transmittance with increasing wavelength in a wavelength range of 600 nm to 800 nm and, when a wavelength which lies in the wavelength range of 600 nm to 800 nm and at which the spectral transmittance of the laminate is 50% is defined as an infrared cut-off wavelength, the infrared cut-off wavelength for light incident on the laminate at an incident angle of 0° is in a range of 620 nm to 680 nm; and
   (v) the laminate has an increasing spectral transmittance with increasing wavelength in a wavelength range of 350 nm to 450 nm and, when a wavelength which lies in the wavelength range of 350 nm to 450 nm and at which the spectral transmittance of the laminate is 50% is defined as an ultraviolet cut-off wavelength, the ultraviolet cut-off wavelength for light incident on the laminate at an incident angle of 0° is in a range of 380 nm to 420 nm.
The present invention also provides an optical filter including:
   a transparent dielectric substrate; and
   a light-absorbing layer formed by a cured product of a light-absorbing composition and disposed parallel to one principal surface of the transparent dielectric substrate, the light-absorbing composition including: a light absorber formed by a phosphonic acid represented by the following formula (a) and copper ion; a phosphoric acid ester allowing the light absorber to be dispersed; and a curable resin, the light absorber being dispersed in the light-absorbing composition:

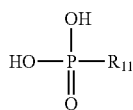
(a)

wherein $R_{11}$ is a phenyl group or a halogenated phenyl group in which at least one hydrogen atom of a phenyl group is substituted by a halogen atom,
   wherein
   (I) the optical filter has an average spectral transmittance of 80% or more in a wavelength range of 450 nm to 600 nm, (II) the optical filter has a spectral transmittance of 1% or less in a wavelength range of 750 nm to 900 nm,
(III) the optical filter has an average spectral transmittance of 4% or less in a wavelength range of 350 nm to 370 nm,
(IV) the optical filter has a decreasing spectral transmittance with increasing wavelength in a wavelength range of 600 nm to 800 nm and, when a wavelength which lies in the wavelength range of 600 nm to 800 nm and at which the spectral transmittance of the optical filter is 50% is defined as an infrared cut-off wavelength, the infrared cut-off wavelength for light incident on the optical filter at an incident angle of 0° is in a range of 620 nm to 680 nm, and
(V) the optical filter has an increasing spectral transmittance with increasing wavelength in a wavelength range of 350 nm to 450 nm and, when a wavelength which lies in the wavelength range of 350 nm to 450 nm and at which the spectral transmittance of the optical filter is 50% is defined as an ultraviolet cut-off wavelength, the ultraviolet cut-off wavelength for light incident on the optical filter at an incident angle of 0° is in a range of 380 nm to 420 nm.

Advantageous Effects of Invention

The above optical filter has properties advantageous for allowing the spectral sensitivity of an imaging sensor to approximate to the visual sensitivity of humans and is capable of achieving the desired properties with a simple configuration without the need for complicated steps. Such an optical filter can be produced using the above light-absorbing composition.

DESCRIPTION OF EMBODIMENTS

Figure 1:
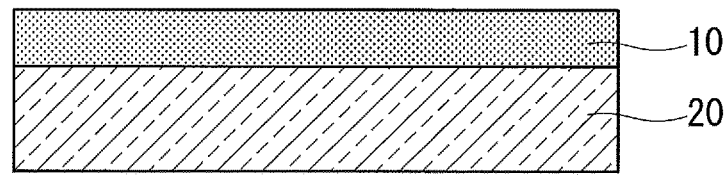
FIG. 1 is a cross-sectional view showing an optical filter according to an example of the present invention.

Hereinafter, embodiments of the present invention will be described with reference to the drawings. The following description is directed to some examples of the present invention, and the present invention is not limited by these examples.

A light-absorbing composition according to the present invention includes: a light absorber formed by a phosphonic acid represented by the following formula (a) and copper ion, the light absorber being dispersed in the light-absorbing composition; a phosphoric acid ester allowing the light absorber to be dispersed; and a curable resin.

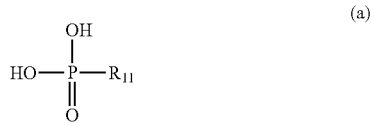

(a)

wherein $R_{11}$ is a phenyl group or a halogenated phenyl group in which at least one hydrogen atom of a phenyl group is substituted by a halogen atom.

When the light-absorbing composition according to the present invention is applied and cured on one principal surface of a transparent dielectric substrate to form a laminate consisting of a light-absorbing layer being a cured product of the light-absorbing composition and the transparent dielectric substrate, the laminate satisfies the following requirements (i) to (v).

(i) The laminate has an average spectral transmittance of 80% or more in a wavelength range of 450 nm to 600 nm.

(ii) The laminate has a spectral transmittance of 1% or less in a wavelength range of 750 nm to 900 nm.

(iii) The laminate has an average spectral transmittance of 4% or less in a wavelength range of 350 nm to 370 nm.

(iv) The laminate has a decreasing spectral transmittance with increasing wavelength in a wavelength range of 600 nm to 800 nm and, when a wavelength which lies in the wavelength range of 600 nm to 800 nm and at which the spectral transmittance of the laminate is 50% is defined as an infrared cut-off wavelength (IR cut-off wavelength), the infrared cut-off wavelength for light incident on the laminate at an incident angle of 0° is in a range of 620 nm to 680 nm.

(v) The laminate has an increasing spectral transmittance with increasing wavelength in a wavelength range of 350 nm to 450 nm and, when a wavelength which lies in the wavelength range of 350 nm to 450 nm and at which the spectral transmittance of the laminate is 50% is defined as an ultraviolet cut-off wavelength (UV cut-off wavelength), the ultraviolet cut-off wavelength for light incident on the laminate at an incident angle of 0° is in a range of 380 nm to 420 nm.

The transparent dielectric substrate of the laminate has, for example, an average spectral transmittance of 90% or more in a wavelength range of 450 nm to 600 nm. The transparent dielectric substrate of the laminate typically has an average spectral transmittance of 90% or more in a wavelength range of 350 nm to 900 nm.

Through a lot of trial and error, the present inventors have newly found that the use of a phosphonic acid represented by the formula (a) as a particular phosphonic acid is more likely to provide the laminate with properties satisfying the above requirements (i) to (v) than the use of any other phosphonic acid. The light-absorbing composition and optical filter according to the present invention have been invented based on the new finding.

As shown in FIGS. 1 to 4, optical filters 1a to 1d exemplifying the optical filter according to the present invention include a transparent dielectric substrate 20 and a light-absorbing layer 10. The light-absorbing layer 10 is formed by a cured product of a light-absorbing composition and disposed parallel to one principal surface of the transparent dielectric substrate 20, the light-absorbing composition including: a light absorber formed by a phosphonic acid represented by the formula (a) and copper ion; a phosphoric acid ester allowing the light absorber to be dispersed; and a curable resin, the light absorber being dispersed in the light-absorbing composition. The optical filter 1a satisfies the following requirements (I) to (V).

(I) The optical filters 1a to 1d have an average spectral transmittance of 80% or more in a wavelength range of 450 nm to 600 nm.

(II) The optical filters 1a to 1d have a spectral transmittance of 1% or less in a wavelength range of 750 nm to 900 nm.

(III) The optical filters 1a to 1d have an average spectral transmittance of 4% or less in a wavelength range of 350 nm to 370 nm.

(IV) The optical filters 1a to 1d have a decreasing spectral transmittance with increasing wavelength in a wavelength range of 600 nm to 800 nm. When a wavelength which lies in the wavelength range of 600 nm to 800 nm and at which the spectral transmittance of the optical filters 1a to 1d is 50% is defined as an infrared cut-off wavelength, the infrared cut-off wavelength for light incident on the optical filters 1a to 1d at an incident angle of 0° is in a range of 620 nm to 680 nm.

(V) The optical filters 1a to 1d have an increasing spectral transmittance with increasing wavelength in a wavelength range of 350 nm to 450 nm. When a wavelength which lies in the wavelength range of 350 nm to 450 nm and at which the spectral transmittance of the optical filters 1a to 1d is 50% is defined as an ultraviolet cut-off wavelength, the ultraviolet cut-off wavelength for light incident on the optical filters 1a to 1d at an incident angle of 0° is in a range of 380 nm to 420 nm.

By virtue of the fact that the optical filters 1a to 1d satisfy the above requirement (I), when any of the optical filters 1a to 1d is disposed ahead of an imaging sensor, the imaging sensor receives a large amount of visible light in the wavelength range of 450 nm to 600 nm. By virtue of the fact that the optical filters 1a to 1d satisfy the above requirement (II), the optical filters 1a to 1d can advantageously shield against infrared light with a wavelength of 750 nm to 900 nm. Additionally, by virtue of the fact that the optical filters 1a to 1d satisfy the above requirement (III), the optical filters 1a to 1d can advantageously shield against ultraviolet light with a wavelength of 370 nm or less. In consequence, disposing any of the optical filters 1a to 1d ahead of an imaging sensor advantageously allows the spectral sensitivity of the imaging sensor to approximate to the visual sensitivity of humans. Further, by virtue of the fact that the optical filters 1a to 1d satisfy the above requirements (IV) and (V), the optical filters 1a to 1d advantageously shield against light in the infrared and ultraviolet regions. In consequence, disposing any of the optical filters 1a to 1d ahead of an imaging sensor advantageously allows the spectral sensitivity of the imaging sensor to approximate to the visual sensitivity of humans.

Concerning the above requirements (i) and (I), the laminate desirably has an average spectral transmittance of 85% or more in the wavelength range of 450 nm to 600 nm, and the optical filters 1a to 1d desirably have an average spectral transmittance of 85% or more in the wavelength range of 450 nm to 600 nm. In this case, when any of the optical filters 1a to 1d is disposed ahead of an imaging sensor, the imaging sensor receives a larger amount of visible light in the wavelength range of 450 nm to 600 nm.

Concerning the above requirements (ii) and (II), the laminate desirably has a spectral transmittance of 0.5% or less in the wavelength range of 750 nm to 900 nm, and the optical filters 1a to 1d desirably have a spectral transmittance of 0.5% or less in the wavelength range of 750 nm to 900 nm. Concerning the above requirements (iii) and (III), the laminate desirably has an average spectral transmittance of 1% or less in the wavelength range of 350 nm to 370 nm, and the optical filters 1a to 1d desirably have an average spectral transmittance of 1% or less in the wavelength range of 350 nm to 370 nm. In this case, disposing any of the optical filters 1a to 1d ahead of an imaging sensor allows the spectral sensitivity of the imaging sensor to further approximate to the visual sensitivity of humans.

Concerning the above requirements (iv) and (IV), the infrared cut-off wavelength for light incident on the laminate at an incident angle of 0° is desirably 630 nm or more or 660 nm or less. Further, the infrared cut-off wavelength for light incident on the optical filters 1a to 1d at an incident angle of 0° is desirably 630 nm or more or 660 nm or less. Concerning the requirements (v) and (V), the ultraviolet cut-off wavelength for light incident on the laminate at an incident angle of 0° is desirably 390 nm or more or 410 nm or less. Further, the ultraviolet cut-off wavelength for light incident on the optical filters 1a to 1d at an incident angle of 0° is desirably 390 nm or more or 410 nm or less. In this case, disposing any of the optical filters 1a to 1d ahead of an imaging sensor allows the spectral sensitivity of the imaging sensor to further approximate to the visual sensitivity of humans.

Desirably, the laminate further satisfies the following requirements (vi) and (vii).

(vi) The difference between the infrared cut-off wavelength for light incident on the laminate at an incident angle of 0° and the infrared cut-off wavelength for light incident on the laminate at an incident angle of 40° is 20 nm or less and desirably 10 nm or less.

(vii) The difference between the ultraviolet cut-off wavelength for light incident on the laminate at an incident angle of 0° and the ultraviolet cut-off wavelength for light incident on the laminate at an incident angle of 40° is 20 nm or less and desirably 10 nm or less.

When the laminate satisfies the above requirements (vi) and (vii), the optical filters 1a to 1d further satisfy the following requirements (VI) and (VII).

(VI) The difference between the infrared cut-off wavelength for light incident on the optical filters 1a to 1d at an incident angle of 0° and the infrared cut-off wavelength for light incident on the optical filters 1a to 1d at an incident angle of 40° is 20 nm or less and desirably 10 nm or less.

(VII) The difference between the ultraviolet cut-off wavelength for light incident on the optical filters 1a to 1d at an incident angle of 0° and the ultraviolet cut-off wavelength for light incident on the optical filters 1a to 1d at an incident angle of 40° is 20 nm or less and desirably 10 nm or less.

When any of the optical filters 1a to 1d satisfying the above requirements (VI) and (VII) is disposed ahead of an imaging sensor, the spectral sensitivity of the imaging sensor does not vary much according to the incident angle of light incident on the imaging sensor.

The transparent dielectric substrate 20 in the optical filters 1a to 1d is not limited to any particular one as long as the substrate 20 is a dielectric substrate having an average spectral transmittance of 90% or more in the wavelength range of 450 nm to 600 nm. In some cases, the transparent dielectric substrate 20 may be a substrate made of a glass containing CuO (copper oxide) which has the ability to absorb light in the infrared region. Also in this case, the optical filters 1a to 1d satisfying the above requirements (I) to (V) can be obtained. Naturally, the transparent dielectric substrate 20 may have an average spectral transmittance of 90% or more, for example, in a wavelength range of 350 nm to 900 nm. The material of the transparent dielectric substrate 20 is not limited to any particular material, and the material is, for example, a certain type of glass or resin. When the material of the transparent dielectric substrate 20 is a glass, the transparent dielectric substrate 20 is, for example, a transparent glass substrate or an infrared cut glass substrate made of a silicate glass such as soda-lime glass or borosilicate glass. The infrared cut glass substrate is made of, for example, a phosphate glass or fluorophosphate glass containing CuO. When the transparent dielectric substrate 20 is an infrared cut glass substrate, the infrared-absorbing ability required of the light-absorbing layer 10 can be decreased thanks to the infrared-absorbing ability of the infrared cut glass substrate. This can result in a reduction in the thickness of the light-absorbing layer 10 or a decrease in the concentration of the light absorber in the light-absorbing layer 10. For the infrared cut glass substrate, the infrared cut-off wavelength in the transmittance spectrum tends to lie on a relatively long-wavelength side. Thus, if the light-absorbing composition is cured to form the light-absorbing layer 10 on the transparent dielectric substrate 20 which is the infrared cut glass substrate, the infrared cut-off wavelength of the optical filters 1a to 1d is likely to lie on the short-wavelength side, and this makes the spectral sensitivity of the imaging sensor more likely to agree with the visual sensitivity of humans.

When the material of the transparent dielectric substrate 20 is a resin, the resin is, for example, a cyclic olefin resin such as a norbornene resin, a polyarylate resin, an acrylic resin, a modified acrylic resin, a polyimide resin, a polyetherimide resin, a polysulfone resin, a polyethersulfone resin, a polycarbonate resin, or a silicone resin.

As seen from the formula (a), the phosphonic acid for forming the light absorber contains a phenyl group or a halogenated phenyl group in which at least one hydrogen atom of a phenyl group is substituted by a halogen atom. The phenyl group and halogenated phenyl group have high lipophilicity and hence high compatibility with organic solvents such as toluene, thus reducing the likelihood of aggregation of the light absorber. Thanks to the phenyl group or halogenated phenyl group of the phosphonic acid for forming the light absorber, the light-absorbing layer 10 of the optical filters 1a to 1d is likely to have a flexible structure. Consequently, the light-absorbing layer 10 has high crack resistance.

In the light-absorbing composition including the light absorber formed by the phosphonic acid represented by the formula (a) and copper ion, the ratio of the content of the phosphonic acid to the content of the phosphoric acid ester is, for example, 0.10 to 0.48 on a mass basis, and the ratio of the content of the phosphonic acid to the content of the copper ion is, for example, 0.45 to 0.80 on an amount-of-substance (mole) basis. In this case, the light absorber is likely to be well dispersed in the light-absorbing composition.

For example, in the light-absorbing layer 10 of the optical filters 1a to 1d, the ratio of the content of the phosphonic acid to the content of the phosphoric acid ester is 0.10 to 0.48 on a mass basis, and the ratio of the content of the phosphonic acid to the content of the copper ion is 0.45 to 0.80 on an amount-of-substance (mole) basis.

In some cases, the light-absorbing composition may further include an auxiliary light absorber formed by a phosphonic acid represented by the following formula (b) and copper ion.

wherein $R_{12}$ is an alkyl group having 6 or less carbon atoms.

For example, the light-absorbing layer 10 of the optical filters 1a to 1d further includes an auxiliary light absorber formed by a phosphonic acid represented by the formula (b) and copper ion.

The inclusion of the auxiliary light absorber in the light-absorbing composition can, for example, advantageously reduce the light transmittance of the optical filters 1a to 1d at a wavelength of 850 nm or more or at a wavelength of 900 nm or more. The alkyl group $R_{12}$ may be linear or branched. The ratio of the content of the phosphonic acid represented by the formula (b) to the content of the phosphonic acid represented by the formula (a) is, for example, 0.05 to 0.50, desirably 0.07 to 0.30, on a mass basis.

The phosphoric acid ester included in the light-absorbing composition is not limited to any particular one, as long as the phosphoric acid ester allows good dispersion of the light absorber. For example, the phosphoric acid ester includes at least one of a phosphoric acid diester represented by the following formula (c1) and a phosphoric acid monoester represented by the following formula (c2). In this case, the light absorber can be more reliably dispersed in the light-absorbing composition without being aggregated. In the formulae (c1) and (c2), $R_{21}$, $R_{22}$, and $R_3$ are each a monovalent functional group represented by $—(CH_2CH_2O)_nR_4$, wherein n is an integer of 1 to 25 and $R_4$ is an alkyl group having 6 to 25 carbon atoms. $R_{21}$, $R_{22}$, and $R_3$ may be the same or different functional groups.

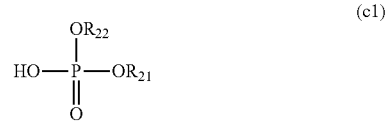

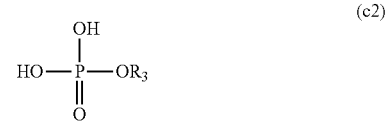

The light absorber is formed, for example, by coordination of a phosphonic acid represented by the formula (a) to copper ion. For example, fine particles containing at least the light absorber are present in the light-absorbing composition. In this case, the action of the phosphoric acid ester allows the fine particles to be dispersed in the light-absorbing composition without aggregation. The average particle diameter of the fine particles is, for example, 5 nm to 200 nm. When the average particle diameter of the fine particles is 5 nm or more, no particular ultramiconization process is required to obtain the fine particles, and the risk of structural destruction of the fine particles containing the light absorber is low. Additionally, the fine particles are well dispersed in the light-absorbing composition. When the average particle diameter of the fine particles is 200 nm or less, it is possible to reduce the influence of Mie scattering, increase the visible transmittance of the optical filter, and prevent deterioration of the properties such as contrast and haze of an image captured by an imaging apparatus. The average particle diameter of the fine particles is desirably 100 nm or less. In this case, the influence of Rayleigh scattering is reduced, and thus the light-absorbing layer formed using the light-absorbing composition has an increased transparency to visible light. The average particle diameter of the fine particles is more desirably 75 nm or less. In this case, the transparency of the light-absorbing layer to visible light is especially high. The average particle diameter of the fine particles can be measured by a dynamic light scattering method.

When the light-absorbing composition includes an auxiliary light absorber, the auxiliary light absorber is formed, for example, by coordination of a phosphonic acid represented by the formula (b) to copper ion. For example, fine particles containing at least the auxiliary light absorber are present in the light-absorbing composition. The average particle diameter of the fine particles containing the auxiliary light absorber is, for example, similar to the average particle diameter of the fine particles containing the light absorber.

The source of copper ion in the light-absorbing composition is, for example, a copper salt. The copper salt is, for example, copper acetate or a hydrate of copper acetate. Examples of the copper salt include anhydrides and hydrates of copper chloride, copper formate, copper stearate, copper benzoate, copper pyrophosphate, copper naphthenate, and copper citrate. For example, copper acetate monohydrate is represented by $Cu(CH_3COO)_2 \cdot H_2O$, and 1 mol of copper acetate monohydrate supplies 1 mol of copper ion.

The curable resin of the light-absorbing composition is, for example, a resin in which the light absorber is dispersible, which is heat-curable or ultraviolet-curable, and the cured product of which is transparent to light with a wavelength of 350 nm to 900 nm. The content of the phosphonic acid represented by the formula (a) is, for example, 3 to 180 parts by mass with respect to 100 parts by mass of the curable resin.

The curable resin of the light-absorbing composition is desirably a polysiloxane (silicone resin). In this case, the heat resistance of the light-absorbing layer formed by the light-absorbing composition can be increased. The polysiloxane desirably contains an aryl group such as a phenyl group. If a resin layer included in an optical filter is hard (rigid), the likelihood of cure shrinkage-induced cracking during the production process of the optical filter increases with increasing thickness of the resin layer. When the curable resin of the light-absorbing composition is a polysiloxane containing an aryl group, the light-absorbing layer formed by the light-absorbing composition is likely to have high crack resistance. A polysiloxane containing an aryl group has high compatibility with a phosphonic acid having a phenyl group or a halogenated phenyl group and reduces the likelihood of aggregation of the light absorber. Further, when the curable resin of the light-absorbing composition is a polysiloxane containing an aryl group, it is desirable for the phosphoric acid ester included in the light-absorbing composition to have a linear organic functional group such as an oxyalkyl group which has flexibility, just as does the phosphoric acid ester represented by the formula (c1) or formula (c2). This is because interaction derived from the combination of a phosphonic acid having a phenyl group or a halogenated phenyl group, a polysiloxane containing an aryl group, and a phosphoric acid ester having a linear organic functional group such as an oxyalkyl group enables the light absorber to have high compatibility with the curable resin and the phosphoric acid ester and allows curing of the light-absorbing composition to yield a light-absorbing layer having both desired rigidity and desired flexibility. Specific examples of the polysiloxane available as the curable resin include KR-255, KR-300, KR-2621-1, KR-211, KR-311, KR-216, KR-212, and KR-251. All of these are silicone resins manufactured by Shin-Etsu Chemical Co., Ltd. Other resins such as an acrylic resin, an epoxy resin, and a vinyl acetal resin can also be used as the curable resin. These resins may contain any of a monofunctional or polyfunctional monomer, an oligomer, and a polymer as a structural unit. A polysiloxane (silicone resin) is expected to exhibit high adhesion to a glass substrate containing $SiO_2$ or to a dielectric film having a $SiO_2$ layer in contact with the polysiloxane.

An exemplary method for preparing the light-absorbing composition according to the present invention will now be described. First, a copper salt such as copper acetate monohydrate is added to a given solvent such as tetrahydrofuran (THF), and the mixture is stirred to give a copper salt solution. To this copper salt solution are then added phosphoric acid ester compounds such as a phosphoric acid diester represented by the formula (c1) and a phosphoric acid monoester represented by the formula (c2), and the mixture is stirred to prepare a solution A.

A solution B is also prepared by adding a phosphonic acid represented by the formula (a) to a given solvent such as THF and stirring the mixture. In preparation of the solution B, a phosphonic acid represented by the formula (b) may be added to the given solvent if necessary. Next, the solution B is added to the solution A while the solution A is stirred, and the mixture is further stirred for a given period of time. To the resulting solution is then added a given solvent such as toluene, and the mixture is stirred to give a solution C. Subsequently, the solution C is subjected to solvent removal under heating for a given period of time. This process removes the solvent such as THF and the component such as acetic acid (boiling point: about 118° C.) generated by disassociation of the copper salt, thus yielding a light absorber formed by the phosphonic acid represented by the formula (a) and copper ion. The temperature at which the solution C is heated is chosen based on the boiling point of the to-be-removed component disassociated from the copper salt. During the solvent removal, the solvent such as toluene (boiling point: about 110° C.) used to obtain the solution C is also evaporated. A certain amount of this solvent desirably remains in the light-absorbing composition. This is preferably taken into account in determining the amount of the solvent to be added and the time period of the solvent removal. To obtain the solution C, o-xylene (boiling point: about 144° C.) may be used instead of toluene. In this case, the amount of o-xylene to be added can be reduced to about one-fourth of the amount of toluene to be added, because the boiling of o-xylene is higher than the boiling point of toluene.

The solvent removal from the solution C is followed by addition of a curable resin such as a polysiloxane (silicone resin) and then by stirring for a given period of time. This is an example of how to prepare the light-absorbing composition according to the present invention. The solvents used for preparation of the light-absorbing composition desirably have certain polarities in order to achieve appropriate formation of the light absorber by the phosphonic acid represented by the formula (a) and copper ion. This is because the polarities of the solvents have influence on how fine particles containing at least the light absorber are dispersed in the light-absorbing composition. For example, solvents having appropriate polarities are chosen depending on the types of the phosphoric acid esters used for preparation of the solution A.

Figure 3:
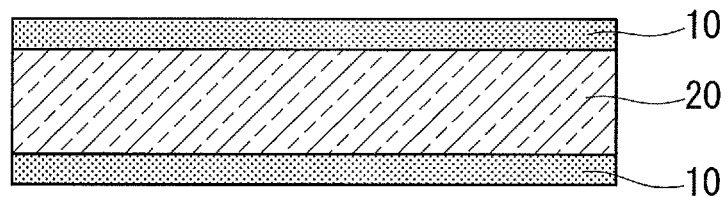
FIG. 3 is a cross-sectional view showing an optical filter according to still another example of the present invention.

The light-absorbing layer 10 of the optical filters 1a to 1d has a thickness of, for example, 30 µm to 800 µm. In this case, the optical filters 1a to 1d advantageously satisfy the above requirements (I) to (V). When the light-absorbing layer 10 is provided in the form of two or more separate layers as shown in FIG. 3, the total thickness of the separate layers is defined as the thickness of the light-absorbing layer 10. As previously described, the use of a polysiloxane containing an aryl group as the curable resin of the light-absorbing composition allows curing of the light-absorbing composition to yield a light-absorbing layer having both desired rigidity and desired flexibility. Thus, with the use of a polysiloxane containing an aryl group as the curable resin of the light-absorbing composition, the thickness of the light-absorbing layer 10 can be increased relatively easily, so that a large amount of the light absorber can be included in the light-absorbing layer. When a polysiloxane containing an aryl group is used as the curable resin of the light-absorbing composition, the thickness of the light-absorbing layer 10 of the optical filters 1a to 1d is desirably 80 µm to 500 µm and more desirably 100 µm to 400 µm.

An exemplary method for producing the optical filter 1a according to an example of the present invention will now be described. First, the light-absorbing composition in a liquid form is applied by spin coating or with a dispenser to one principal surface of the transparent dielectric substrate 20 to form a film on the one principal surface. Next, this film is subjected to a given heat treatment to cure the film. In this manner, the optical filter 1a can be produced. In order to securely form the light-absorbing layer 10 and at the same time improve the optical properties of the optical filter 1a, the maximum of the ambient temperature at which the film is subjected to the heat treatment is, for example, 140° C. or higher and desirably 160° C. or higher. The maximum of the ambient temperature at which the film is subjected to the heat treatment is, for example, 170° C. or lower.

Figure 2:
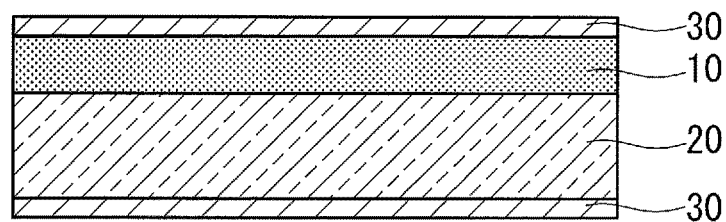
FIG. 2 is a cross-sectional view showing an optical filter according to another example of the present invention.

As shown in FIG. 2, the optical filter 1b according to another example of the present invention includes an infrared-reflecting film 30. The infrared-reflecting film 30 is a film formed by alternating layers of different materials having different refractive indices. The materials forming the infrared-reflecting film 30 are, for example, inorganic materials such as $SiO_2$, $TiO_2$, and $MgF_2$ or organic materials such as fluorine resins. A laminate having the infrared-reflecting film 30 formed on a transparent dielectric substrate, for example, permits transmission of light with a wavelength of 350 nm to 800 nm and reflects light with a wavelength of 850 nm to 1200 nm. The laminate including the infrared-reflecting film 30 has a spectral transmittance of, for example, 85% or more, desirably 90% or more, in a wavelength range of 350 nm to 800 nm and has a spectral transmittance of, for example, 1% or less, desirably 0.5% or less, in a wavelength range of 850 nm to 1200 nm. Thus, the optical filter 1b can more effectively shield against light in a wavelength range of 850 nm to 1200 nm or in a wavelength range of 900 nm to 1200 nm. When the spectral transmittance of the laminate including the infrared-reflecting film 30 has characteristics as described above, it is possible to reduce the influence exerted on the transmittance spectrum of the optical filter 1b by the shift of the transmittance spectrum of the laminate including the infrared-reflecting film 30 with change in incident angle of light. This is because the light absorber formed by a phosphonic acid represented by the formula (a) and copper ion exhibits light-absorbing ability in a region where the transmission spectrum of the infrared-reflecting film shows a wavelength shift with varying incident angle of light.

The method for forming the infrared-reflecting film 30 of the optical filter 1b is not particularly limited, and any of vacuum deposition, sputtering, chemical vapor deposition (CVD), and sol-gel process employing spin coating or spray coating can be used according to the kind of the material forming the infrared-reflecting film 30.

As shown in FIG. 3, the optical filter 1c according to another example of the present invention has the light-absorbing layers 10 formed on both principal surfaces of the transparent dielectric substrate 20. Thus, the light-absorbing layer thickness required for the optical filter 1c to have desired optical properties can be ensured by two light-absorbing layers 10 rather than by one light-absorbing layer 10. The light-absorbing layers 10 on both principal surfaces of the transparent dielectric substrate 20 may have the same or different thicknesses. That is, the formation of the light-absorbing layers 10 on both principal surfaces of the transparent dielectric substrate 20 is done so that the two light-absorbing layers 10 account for equal or unequal proportions of the light-absorbing layer thickness required for the optical filter 1c to have desired optical properties. Thus, the thickness of each of the light-absorbing layers 10 formed on both principal surfaces of the transparent dielectric substrate 20 is relatively small. This can prevent thickness non-uniformity of the light-absorbing layer which can occur when the thickness of the light-absorbing layer is large. Additionally, it is possible to shorten the time spent on the application of the light-absorbing composition in a liquid form and shorten the time taken for curing of the film of the light-absorbing composition applied. If the light-absorbing layer 10 is formed only on one principal surface of the transparent dielectric substrate 20 that is very thin, the optical filter may be warped due to a stress induced by shrinkage occurring during formation of the light-absorbing layer 10 from the light-absorbing composition. The formation of the light-absorbing layers 10 on both principal surfaces of the transparent dielectric substrate 20 can prevent warping of the optical filter 1c even when the transparent dielectric substrate 20 is very thin.

Figure 4:
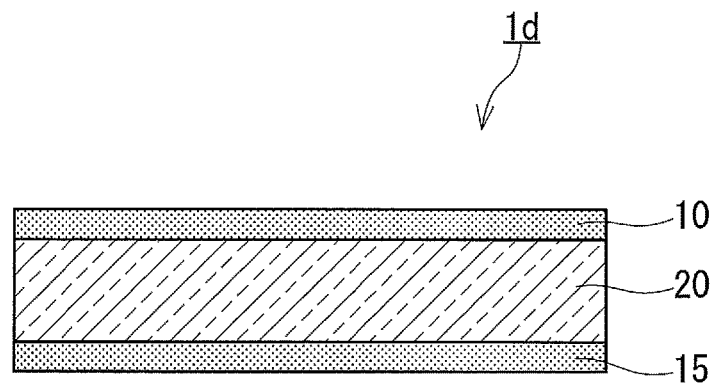
FIG. 4 is a cross-sectional view showing an optical filter according to still another example of the present invention.

As shown in FIG. 4, the optical filter 1d according to another example of the present invention further includes an auxiliary light-absorbing layer 15 disposed parallel to one principal surface of the transparent dielectric substrate 20. The auxiliary light-absorbing layer 15 is formed, for example, by a cured product of an auxiliary light-absorbing composition, the auxiliary light-absorbing composition including: an auxiliary light absorber formed by a phosphonic acid represented by the formula (b) and copper ion; a phosphoric acid ester allowing the auxiliary light absorber to be dispersed; and a curable resin. By this inclusion of the auxiliary light-absorbing layer 15, the optical filter 1d can advantageously reduce the transmittance of light with a wavelength of 850 nm or more or a wavelength of 900 nm or more.

For example, as shown in FIG. 4, the light-absorbing layer 10 is formed on one principal surface of the transparent dielectric substrate 20, and the auxiliary light-absorbing layer 15 is formed on the other principal surface of the transparent dielectric substrate 20. In this case, the stress acting on the transparent dielectric substrate 20 due to the formation of the light-absorbing layer 10 and the stress acting on the transparent dielectric substrate 20 due to the formation of the auxiliary light-absorbing layer 15 are balanced, so that warping of the optical filter 1d can be prevented.

The phosphoric acid ester and curable resin in the auxiliary light-absorbing composition can, for example, be the same as the phosphoric acid ester and curable resin in the light-absorbing composition.

The auxiliary light-absorbing composition in a liquid form is applied by spin coating or with a dispenser to one principal surface of the transparent dielectric substrate 20 to form a film on the one principal surface. Next, the film is subjected to a given heat treatment to cure the film. In this manner, the optical filter 1d can be produced. In order to securely form the auxiliary light-absorbing layer 15 and at the same time improve the optical properties of the optical filter 1d, the maximum of the ambient temperature at which the film is subjected to the heat treatment is, for example, 140° C. or higher and desirably 160° C. or higher. The maximum of the ambient temperature at which the film is subjected to the heat treatment is, for example, 170° C. or lower. The heat treatment for forming the light-absorbing layer 10 and the heat treatment for forming the auxiliary light-absorbing layer 15 may be performed simultaneously.

Figure 5:
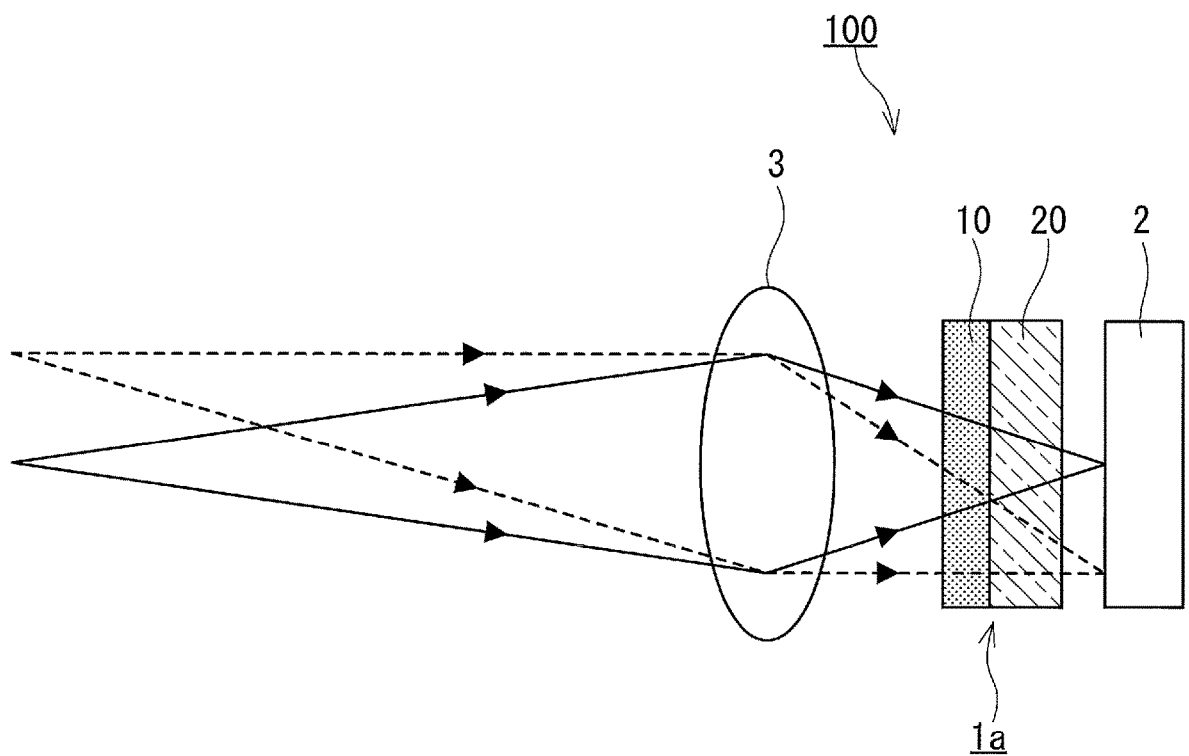
FIG. 5 is a cross-sectional view showing an imaging optical system including an optical filter according to an example of the present invention.

For example, as shown in FIG. 5, an imaging optical system 100 can be provided by the use of the optical filter 1a. The imaging optical system 100 further includes, for example, an imaging lens 3 in addition to the optical filter 1a. The imaging optical system 100 is disposed ahead of an imaging sensor 2 in an imaging apparatus such as a digital camera. The imaging sensor 2 is, for example, an imaging sensor such as a CCD or CMOS. As shown in FIG. 5, light coming from an object is focused by the imaging lens 3, the ultraviolet and infrared portions of the light are cut by the optical filter 1a, and then the light is incident on the imaging sensor 2. Thus, the spectral sensitivity of the imaging sensor 2 approximates to the visual sensitivity of humans, and a favorable image with good color reproduction can be obtained. The imaging optical system 100 may include any of the optical filters 1b, 1c, and 1d instead of the optical filter 1a.

EXAMPLES

The present invention will be described in more detail by examples. The present invention is not limited to the examples given below. First, methods for evaluation of the spectral transmittance of optical filters according to Examples and Comparative Examples will be described.

<Measurement of Transmittance Spectrum of Optical Filter>

Transmittance spectra shown by optical filters according to some of Examples and some of Comparative Examples upon incidence of light in a wavelength range of 300 nm to 1200 nm on the optical filters were measured using an ultraviolet-visible spectrophotometer (manufactured by JASCO Corporation, product name: V-670). In this measurement, the incident angle of light incident on the optical filters according to some of Examples and some of Comparative Examples was set to 0° (degree). To eliminate the influence of the difference in thickness among the light-absorbing layers of the optical filters on the transmittance spectra, the spectra were normalized so that the transmittance in the wavelength range of 750 nm to 900 nm in each spectrum had a given value. Specifically, the transmittance spectra actually measured for the optical filters according to some of Examples and some of Comparative Examples were multiplied by 100/92 to cancel the effect of interfacial reflection, and values of transmittance at different wavelengths were converted to values of absorbance, which were corrected by being multiplied by a normalization coefficient. The resulting values were further multiplied by 92/100 to calculate normalized transmittance spectra. The normalization coefficient was determined for both of the following two conditions (1) and (2).

Condition (1): Adjust the maximum transmittance in the wavelength range of 750 to 900 nm in the actually measured transmittance spectrum to 1.0%.

Condition (2): Adjust the maximum transmittance in the wavelength range of 750 to 900 nm in the actually measured transmittance spectrum to 0.5%.

The conditions (1) and (2) for determination of the normalization coefficient were set by taking into account the transmittance characteristics required of optical filters in the wavelength range of 750 nm to 900 nm. Thus, in testing for the optimization of the materials and conditions used for production of optical filters, it is efficient to form a layer (light-absorbing layer) of appropriate thickness (about 50 µm to 100 µm, for example) using materials to be tested, actually measure the transmittance spectrum of a laminate sample including the layer, normalize the transmittance spectrum according to the predetermined conditions, and evaluate the test objects based on the result of the normalization. In production of optical filters for practical use, it is recommended to employ materials and conditions yielding positive results in the evaluation as described above and adjust the layer thickness so as to obtain a desired transmittance spectrum.

<Evaluation of Incident Angle Dependence of Transmittance Spectrum>

Transmittance spectra shown by optical filters according to some of Examples and some of Comparative Examples upon incidence of light in a wavelength range of 300 nm to 1200 nm on the optical filters at incident angles of 0° and 40° were measured using an ultraviolet-visible spectrophotometer (manufactured by JASCO Corporation, product name: V-670), and the measured spectra were normalized as described above. For each of the optical filters according to some of Examples and some of Comparative Examples, the normalized transmittance spectrum at an incident angle of 0° and the normalized transmittance spectrum at an incident angle of 40° were compared to evaluate the incident angle dependence of the transmittance spectrum.

Example 1

1.125 g of copper acetate monohydrate and 60 g of tetrahydrofuran (THF) were mixed, and the mixture was stirred for 3 hours to obtain a copper acetate solution. To the obtained copper acetate solution was then added 1.55 g of PLYSURF A208F (manufactured by DKS Co., Ltd.) which is a phosphoric acid ester compound, and the mixture was stirred for 30 minutes to obtain a solution A. 10 g of THF was added to 0.4277 g of phenylphosphonic acid (manufactured by Nissan Chemical Industries, Ltd.), and the mixture was stirred for 30 minutes to obtain a solution B-1. 10 g of THF was added to 0.2747 g of 4-bromophenylphosphonic acid (manufactured by Tokyo Chemical Industry Co., Ltd.), and the mixture was stirred for 30 minutes to obtain a solution B-2. Next, the solutions B-1 and B-2 were added to the solution A while the solution A was stirred, and the mixture was stirred at room temperature for 1 minute. To the resulting solution was then added 28 g of toluene, and the mixture was stirred at room temperature for 1 minute to obtain a solution C. This solution C was placed in a flask and subjected to solvent removal using a rotary evaporator (manufactured by Tokyo Rikakikai Co. Ltd., product code: N-1110SF) for 18 minutes under heating by means of an oil bath (manufactured by Tokyo Rikakikai Co. Ltd., product code: OSB-2100). The temperature of the oil bath was controlled to 105° C. The solution subjected to the solvent removal was then collected from the flask. To the collected solution was added 4.400 g of a silicone resin (manufactured by Shin-Etsu Chemical Co., Ltd., product name: KR-300), and the mixture was stirred at room temperature for 30 minutes to obtain a light-absorbing composition according to Example 1. The amounts of the added materials are shown in Table 1. The light-absorbing composition according to Example 1 had high transparency, and fine particles of the light absorber were well dispersed in the light-absorbing composition according to Example 1.

Figure 6A:
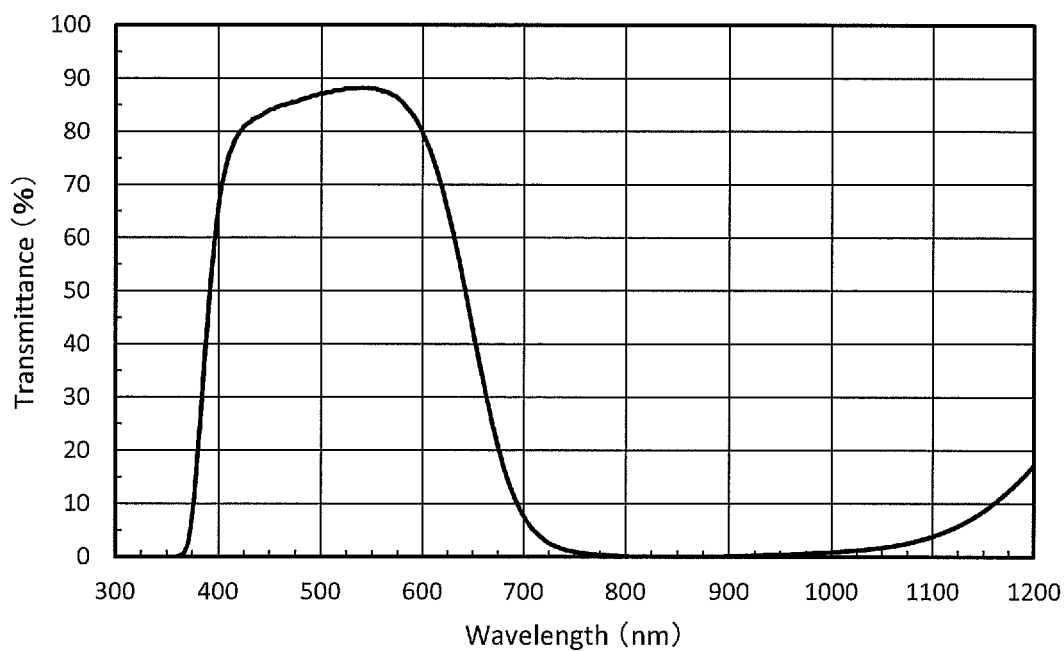
FIG. 6A shows a transmittance spectrum of an optical filter according to Example 1.
Figure 6B:
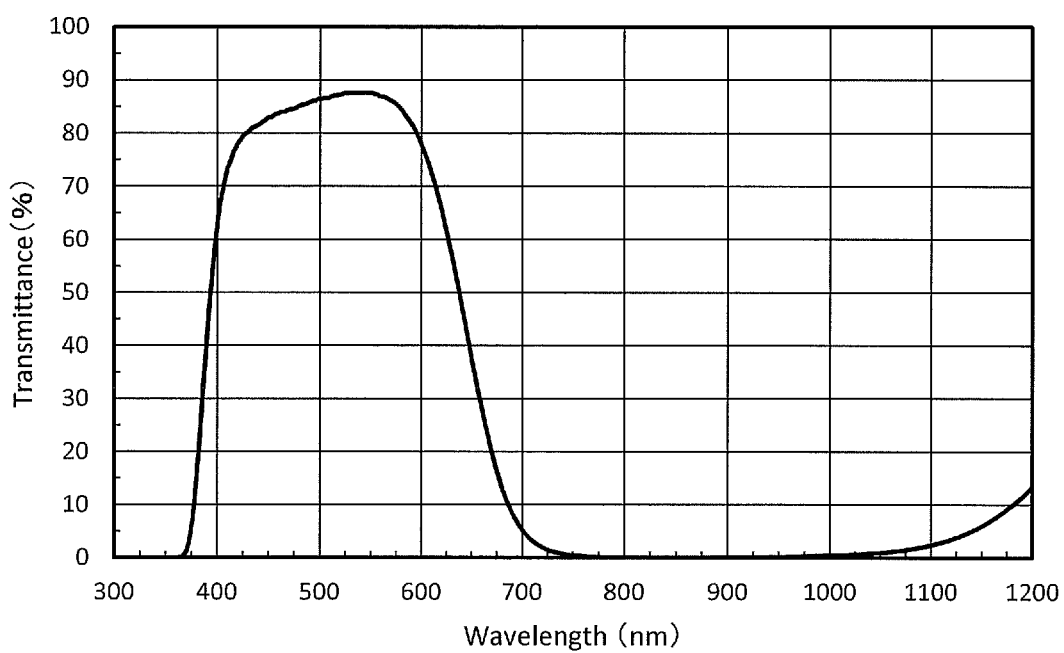
FIG. 6B shows another transmittance spectrum of the optical filter according to Example 1.
Figure 7:
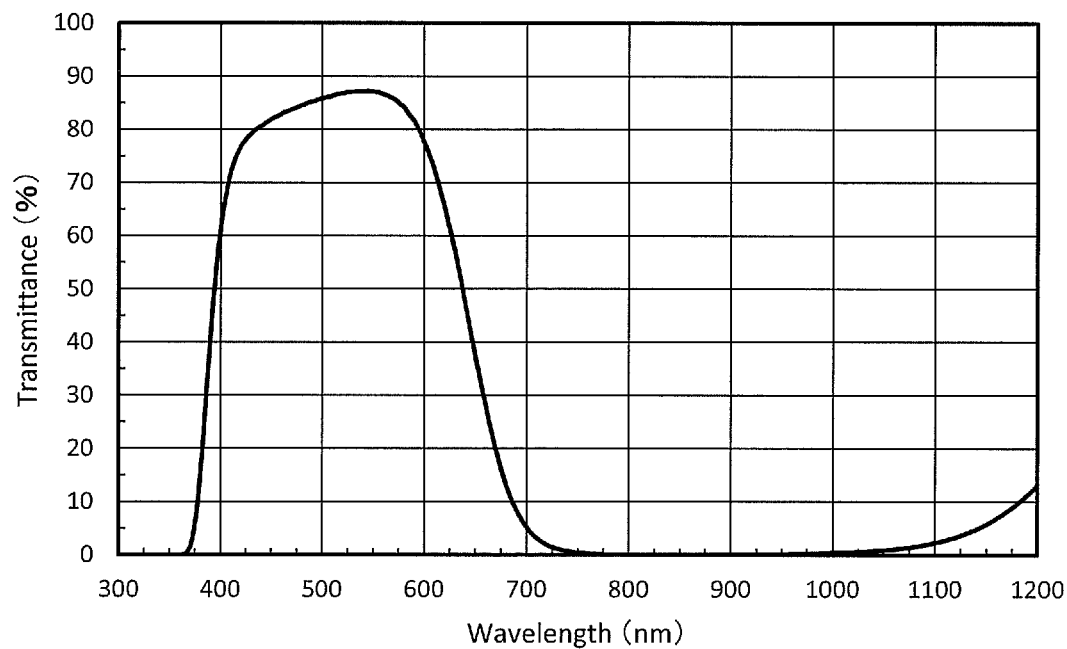
FIG. 7 shows a transmittance spectrum of an optical filter according to Example 19.
Figure 8:
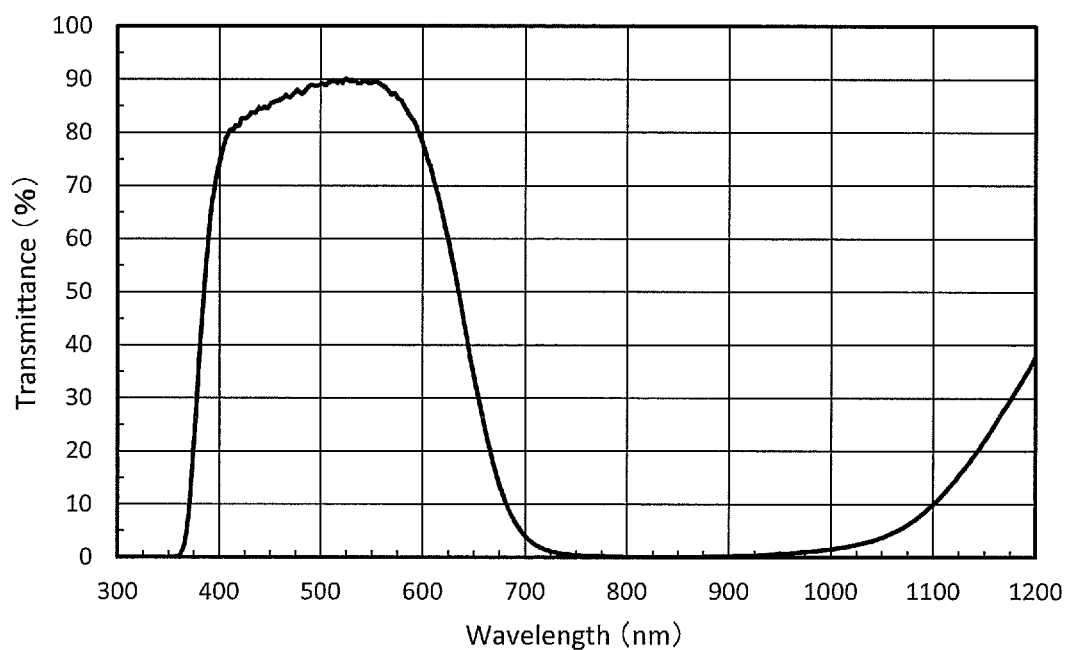
FIG. 8 shows a transmittance spectrum of an optical filter according to Example 20.
Figure 9:
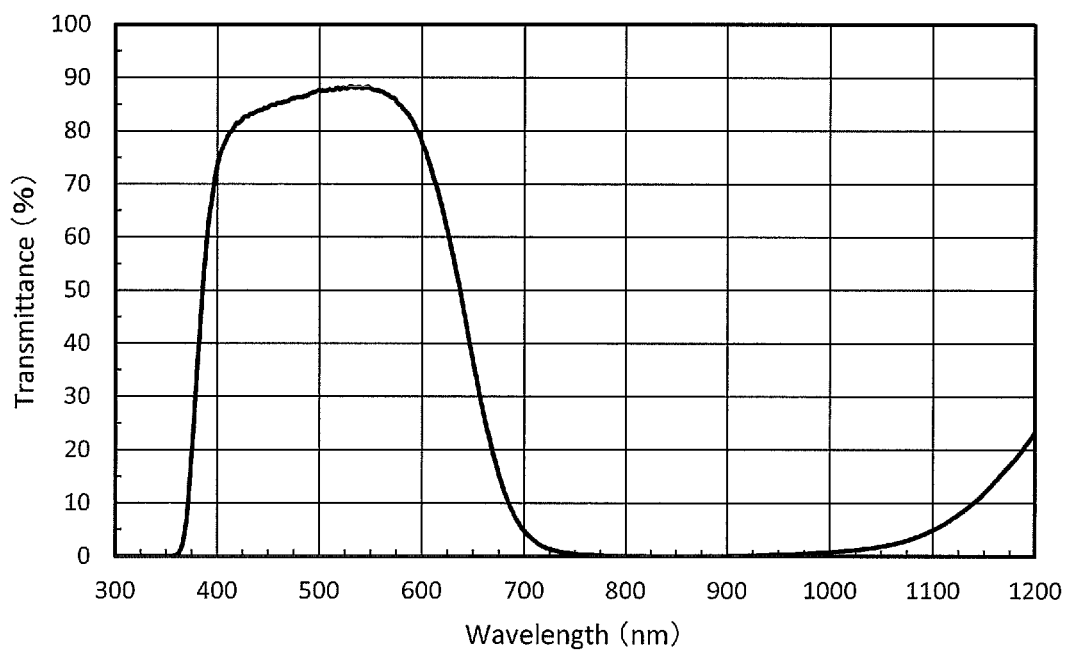
FIG. 9 shows a transmittance spectrum of an optical filter according to Example 21.
Figure 10:
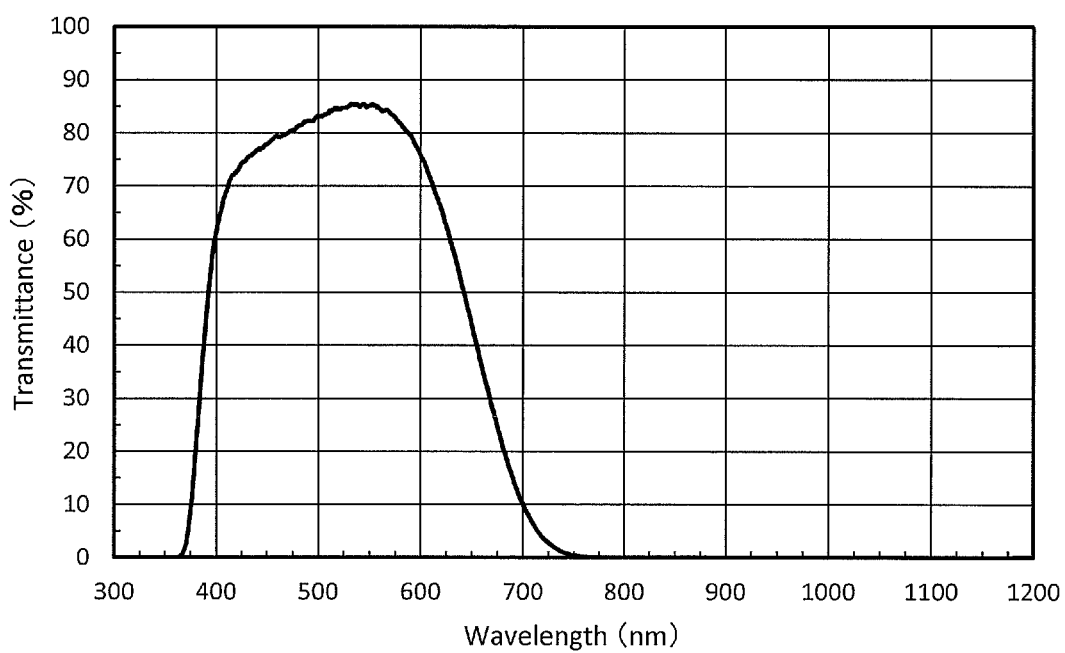
FIG. 10 shows a transmittance spectrum of an optical filter according to Example 22.
Figure 11:
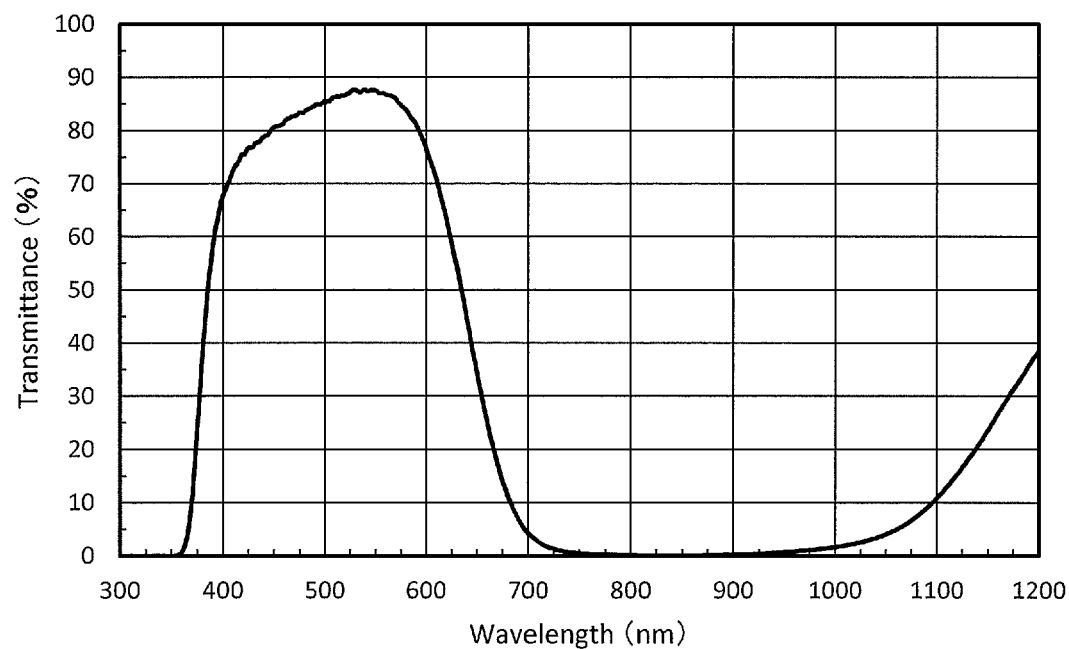
FIG. 11 shows a transmittance spectrum of an optical filter according to Example 23.
Figure 12:
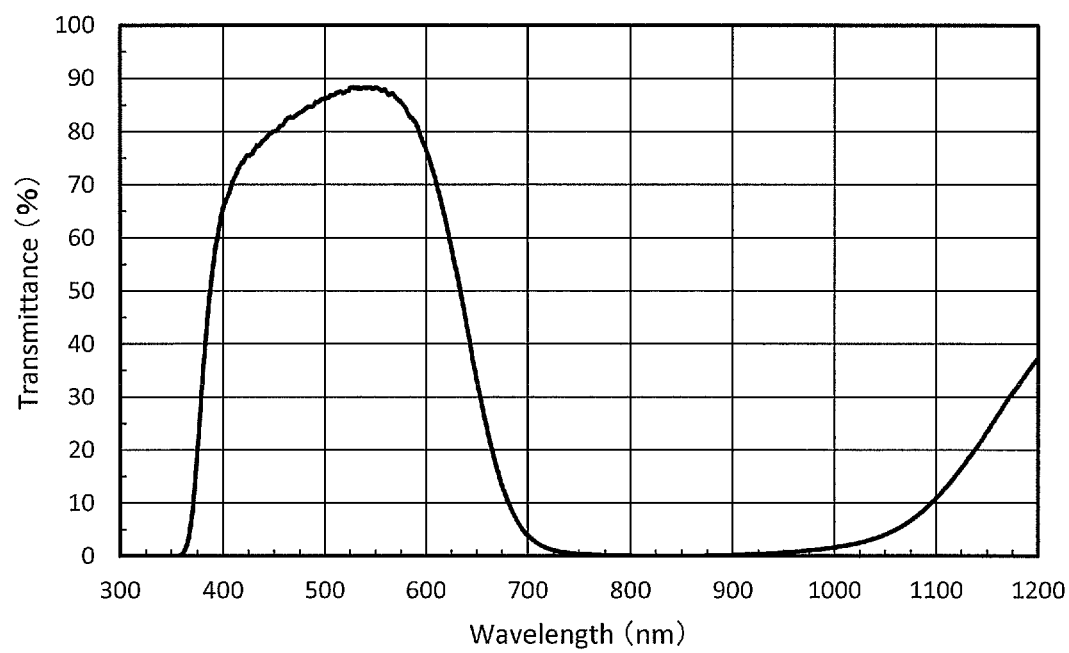
FIG. 12 shows a transmittance spectrum of an optical filter according to Example 24.
Figure 13:
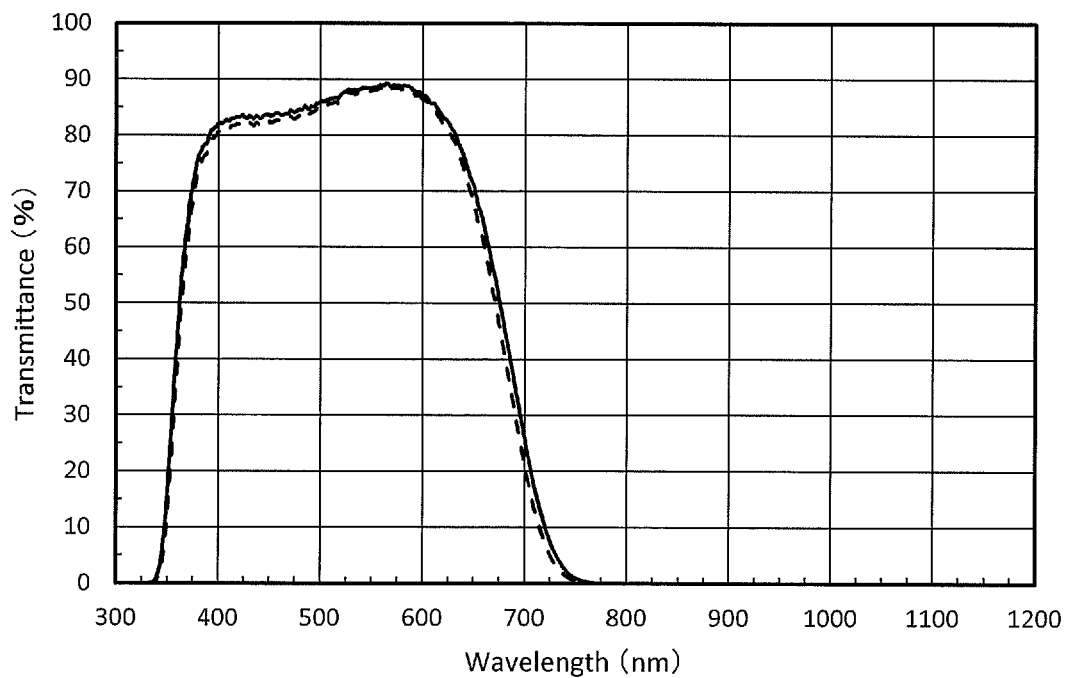
FIG. 13 shows a transmittance spectrum of an optical filter according to Comparative Example 4.
Figure 14:
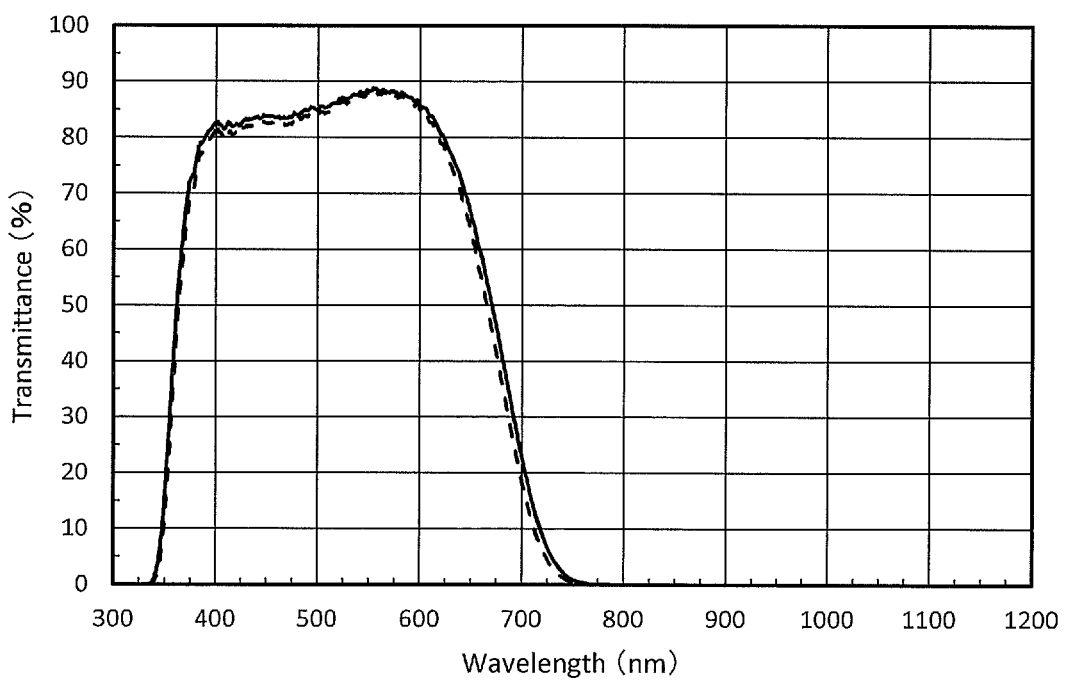
FIG. 14 shows a transmittance spectrum of an optical filter according to Comparative Example 5.
Figure 15:
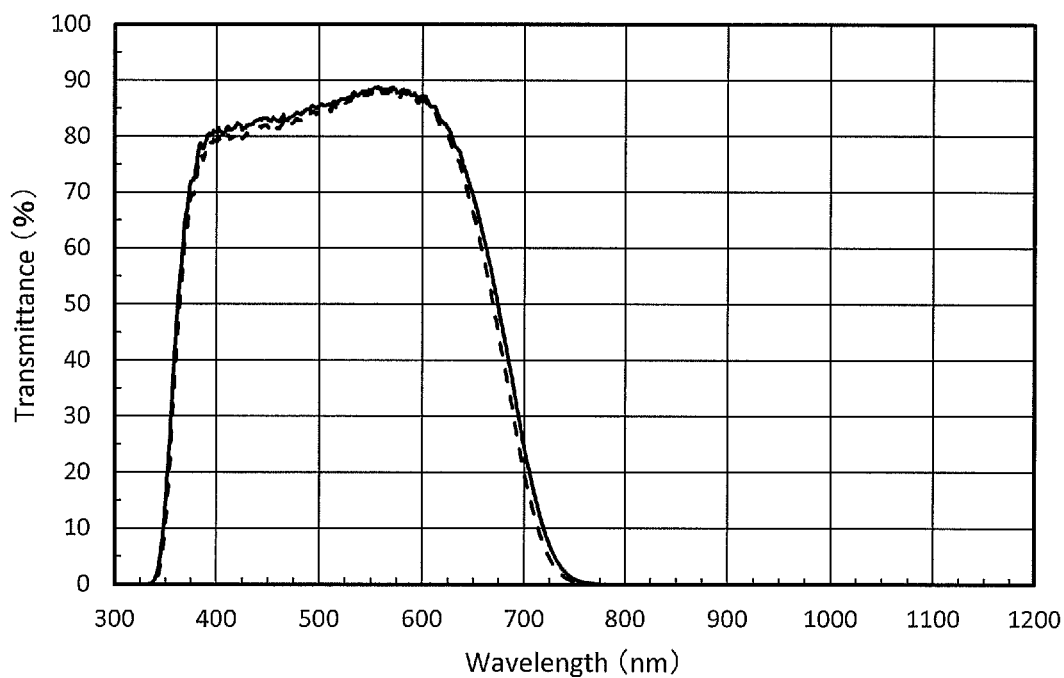
FIG. 15 shows a transmittance spectrum of an optical filter according to Comparative Example 6.
Figure 16:
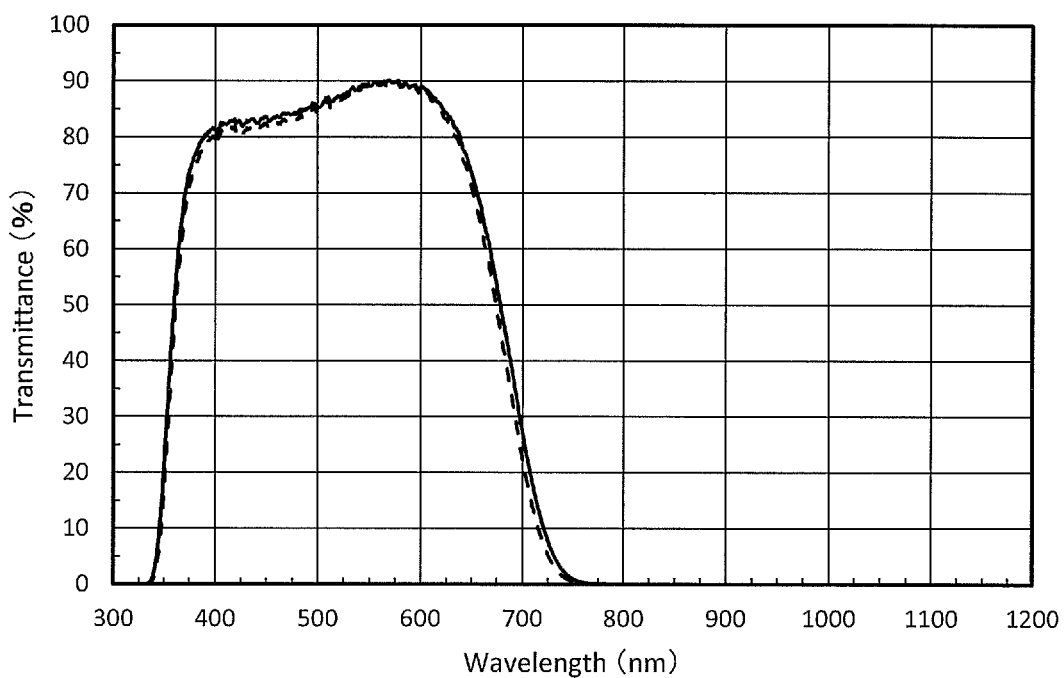
FIG. 16 shows a transmittance spectrum of an optical filter according to Comparative Example 7.

About 0.3 g of the light-absorbing composition according to Example 1 was applied with a dispenser to an about 30 mm×30 mm central region of one principal surface of a transparent glass substrate (manufactured by SCHOTT AG, product name: D263) made of borosilicate glass and having dimensions of 76 mm×76 mm×0.21 mm. A film to be cured was thus formed on the substrate. Subsequently, the transparent glass substrate with the uncured film was placed in an oven, and the film was heat-treated at 85° C. for 3 hours, then at 125° C. for 3 hours, then at 150° C. for 1 hour, and finally at 170° C. for 3 hours. The film was thus cured to produce an optical filter according to Example 1 including a light-absorbing layer. FIG. 6A and FIG. 6B show the transmittance spectra of the optical filter according to Example 1, which are normalized according to the conditions (1) and (2) respectively. The major parameters in the normalized transmittance spectra of the optical filter according to Example 1 are listed in Table 2. As seen from FIG. 6A, FIG. 6B, and Table 2, it was observed that the optical filter according to Example 1 including a light-absorbing layer satisfies the requirements (I) to (V). Further, comparing the normalized transmittance spectrum at an incident angle of 0° and the normalized transmittance spectrum at an incident angle of 40° for the optical filter according to Example 1 revealed that the optical filter according to Example 1 satisfies the requirements (VI) and (VII). This suggested that the optical filter according to Example 1 has properties desired for use with an imaging sensor in an imaging apparatus.

Example 2

1.125 g of copper acetate monohydrate and 60 g of THF were mixed, and the mixture was stirred for 3 hours to obtain a copper acetate solution. To the obtained copper acetate solution was then added 2.3382 g of PLYSURF A208F (manufactured by DKS Co., Ltd.) which is a phosphoric acid ester compound, and the mixture was stirred for 30 minutes to obtain a solution A. 10 g of THF was added to 0.5848 g of phenylphosphonic acid (manufactured by Nissan Chemical Industries, Ltd.), and the mixture was stirred for 30 minutes to obtain a solution B. Next, the solution B was added to the solution A while the solution A was stirred, and the mixture was stirred at room temperature for 1 minute. To the resulting solution was then added 45 g of toluene, and the mixture was stirred at room temperature for 1 minute to obtain a solution C. This solution C was placed in a flask and subjected to solvent removal using a rotary evaporator (manufactured by Tokyo Rikakikai Co. Ltd., product code: N-1110SF) for 25 minutes under heating by means of an oil bath (manufactured by Tokyo Rikakikai Co. Ltd., product code: OSB-2100). The temperature of the oil bath was controlled to 120° C. The solution subjected to the solvent removal was then collected from the flask. To the collected solution was added 4.400 g of a silicone resin (manufactured by Shin-Etsu Chemical Co., Ltd., product name: KR-300), and the mixture was stirred at room temperature for 30 minutes to obtain a light-absorbing composition according to Example 2. The amounts of the added materials are shown in Table 1. In the light-absorbing composition according to Example 2, fine particles of the light absorber were well dispersed. PLYSURF A208F was found to include phosphoric acid ester compounds represented by the formulae (c1) and (c2) wherein $R_{21}$, $R_{22}$, and $R_3$ are the same functional group represented by $(CH_2CH_2O)_nR_4$ wherein $R_4$ is a monovalent group having eight carbon atoms.

An optical filter according to Example 2 was produced in the same manner as that according to Example 1, except that the light-absorbing composition according to Example 2 was used instead of the light-absorbing composition according to Example 1. For the transmittance spectra of the optical filter according to Example 2 which are normalized according to the conditions (1) and (2), the major parameters are listed in Table 2. As seen from Table 2, it was observed that the optical filter according to Example 2 including a light-absorbing layer satisfies the requirements (I) to (V). Further, comparing the normalized transmittance spectrum at an incident angle of 0° and the normalized transmittance spectrum at an incident angle of 40° for the optical filter according to Example 2 revealed that the optical filter according to Example 2 satisfies the requirements (VI) and (VII). This suggested that the optical filter according to Example 2 has properties desired for use with an imaging sensor in an imaging apparatus.

Examples 3 to 18

Light-absorbing compositions according to Examples 3 to 15 were obtained in the same manner as that according to Example 2, except that the amounts of the added phenylphosphonic acid and phosphoric acid ester compound (PLYSURF A208F) were varied as shown in Table 1. A light-absorbing composition according to Example 16 was obtained in the same manner as that according to Example 2, except that NIKKOL DDP-2 (manufactured by Nikko Chemicals Co., Ltd.) was used as a phosphoric acid ester compound instead of PLYSURF A208F and that the amounts of the added phenylphosphonic acid and phosphoric acid ester compound were adjusted as shown in Table 1. NIKKOL DDP-2 includes phosphoric acid ester compounds represented by the formulae (c1) and (c2) wherein $R_{21}$, $R_{22}$, and $R_3$ are the same functional group represented by $(CH_2CH_2O)_mR_5$ wherein m is 2 and $R_5$ is a monovalent group having 12 to 15 carbon atoms. A light-absorbing composition according to Example 17 was obtained in the same manner as that according to Example 2, except that NIKKOL DDP-6 (manufactured by Nikko Chemicals Co., Ltd.) was used as a phosphoric acid ester compound instead of PLYSURF A208F and that the amounts of the added phenylphosphonic acid and phosphoric acid ester compound were adjusted as shown in Table 1. NIKKOL DDP-6 includes phosphoric acid ester compounds represented by the formulae (c1) and (c2) wherein $R_{21}$, $R_{22}$, and $R_3$ are the same functional group represented by $(CH_2CH_2O)_mR_5$ wherein m is 6 and $R_5$ is a monovalent group having 12 to 15 carbon atoms. A light-absorbing composition according to Example 18 was obtained in the same manner as that according to Example 2, except that the amounts of the added phenylphosphonic acid and phosphoric acid ester compound were adjusted as shown in Table 1. In the light-absorbing compositions according to Examples 3 to 18, fine particles of the light absorber were well dispersed.

Optical filters according to Examples 3 to 18 were produced in the same manner as that according to Example 1, except that the light-absorbing compositions according to Examples 3 to 18 were used instead of the light-absorbing composition according to Example 1. For the transmittance spectra of the optical filters according to Examples 3 to 18 which are normalized according to the conditions (1) and (2), the major parameters are listed in Table 2. As seen from Table 2, it was observed that the optical filters according to Examples 3 to 18 each including a light-absorbing layer satisfy the requirements (I) to (V). Further, comparing the normalized transmittance spectrum at an incident angle of 0° and the normalized transmittance spectrum at an incident angle of 40° for each of the optical filters according to Examples 3 to 18 revealed that the optical filters according to Examples 3 to 18 satisfy the requirements (VI) and (VII). This suggested that the optical filters according to Examples 3 to 18 have properties desired for use with an imaging sensor in an imaging apparatus.

Examples 19 to 24

The light-absorbing composition according to Example 1 was applied to one principal surface of a transparent glass substrate (manufactured by SCHOTT AG, product name: D263) made of borosilicate glass and having dimensions of 76 mm×76 mm×0.21 mm. The transparent glass substrate with the uncured film was placed in an oven, and the film was heat-treated at 85° C. for 3 hours, then at 125° C. for 3 hours, then at 150° C. for 1 hour, and finally at 170° C. for 8 hours. The film was thus cured to obtain an optical filter according to Example 19 including a light-absorbing layer. The thickness of the light-absorbing layer of the optical filter according to Example 19 was adjusted so that the maximum of the light transmittance in the wavelength range of 750 nm to 900 nm would be 0.4 to 0.5%. Thus, the thickness of the light-absorbing layer of the optical filter according to Example 19 was chosen based on that transmittance spectrum of the optical filter according to Example 1 which resulted from normalization according to the condition (2). Optical filters according to Examples 20, 21, 22, 23, and 24 were obtained in the same manner as that according to Example 19, except that the light-absorbing compositions according to Examples 2, 6, 13, 15, and 17 were used. The transmittance spectra of the optical filters according to Examples 19 to 24 are shown in FIGS. 7 to 12, respectively. For the optical filters according to Examples 19 to 24, the major parameters concerning the transmittance and the thicknesses of the light-absorbing layers are listed in Table 3. The thicknesses of the light-absorbing layers were measured with a digital micrometer gauge. It was observed that the optical filters according to Examples 19 to 24 satisfy the requirements (I) to (V). It was also suggested that according to Examples 19 to 24, optical filters involving normalization according to the condition (2) can be reproduced. It was further suggested that the optical filters according to Examples 19 to 24 have properties desired for use with an imaging sensor in an imaging apparatus.

Comparative Examples 1 to 7

Compositions according to Comparative Examples 1 and 2 were obtained in the same manner as that according to Example 2, except that the amounts of the added phenylphosphonic acid and phosphoric acid ester compound were changed as shown in Table 4. A composition according to Comparative Example 3 was obtained in the same manner as that according to Example 2, except that 4-bromophenylphosphonic acid was used instead of phenylphosphonic acid and that the amounts of the added 4-bromophenylphosphonic acid and phosphoric acid ester compound were adjusted as shown in Table 4. The compositions according to Comparative Examples 1 to 3 had low transparency. In the compositions according to Comparative Examples 1 to 3, fine particles of copper phosphonate were not dispersed but aggregated. The compositions according to Comparative Examples 1 to 3 were considerably difficult to use as light-absorbing compositions, and optical filters were not able to be produced using the compositions according to Comparative Examples 1 to 3. Comparison of the light-absorbing compositions according to Examples 1 to 18 with the compositions according to Comparative Examples 1 to 3 suggested that, in a light-absorbing composition including a light absorber formed by a phosphonic acid represented by the formula (a) and copper ion, fine particles of the light absorber are likely to be well dispersed when the ratio of the content of the phosphonic acid to the content of a phosphoric acid ester is 0.10 to 0.48 on a mass basis and the ratio of the content of the phosphonic acid to the content of the copper ion is 0.45 to 0.80 on an amount-of-substance (mole) basis.

A light-absorbing composition according to Comparative Example 4 was obtained in the same manner as that according to Example 2, except that n-butylphosphonic acid was used instead of phenylphosphonic acid and that the amounts of the added n-butylphosphonic acid and phosphoric acid ester compound were adjusted as shown in Table 4. Light-absorbing compositions according to Comparative Examples 5 and 6 were obtained in the same manner as that according to Example 2, except that hexylphosphonic acid was used instead of phenylphosphonic acid and that the amounts of the added hexylphosphonic acid and phosphoric acid ester compound were adjusted as shown in Table 4. A light-absorbing composition according to Comparative Example 7 was obtained in the same manner as that according to Example 2, except that ethylphosphonic acid was used instead of phenylphosphonic acid and that the amounts of the added ethylphosphonic acid and phosphoric acid ester compound were adjusted as shown in Table 4. The light-absorbing compositions according to Comparative Examples 4 to 7 had high transparency. In the light-absorbing compositions according to Comparative Examples 4 to 7, fine particles of the light absorber were well dispersed.

Optical filters according to Comparative Examples 4 to 7 were produced in the same manner as that according to Example 1, except that the light-absorbing compositions according to Comparative Examples 4 to 7 were used instead of the light-absorbing composition according to Example 1. FIGS. 13 to 16 respectively show the transmittance spectra of the optical filters according to Comparative Examples 4 to 7, the spectra being normalized according to either of the conditions (1) and (2). In FIGS. 13 to 16, the solid-line graphs represent the transmittance spectra normalized according to the condition (1), and the dashed-line graphs represent the transmittance spectra normalized according to the condition (2). For the transmittance spectra of the optical filters according to Comparative Examples 4 to 7 which are normalized according to the conditions (1) and (2), the major parameters are listed in Table 5. All of the transmittance spectra of the optical filters according to Comparative Examples 4 to 7 which are normalized according to the conditions (1) and (2) failed to satisfy all the conditions (I) to (V) together. In particular, the transmittance spectra of the optical filters according to Comparative Examples 4 to 7 have been suggested to show a tendency that the IR cut-off wavelength lies on a relatively long-wavelength side while the UV cut-off wavelength lies on a relatively short-wavelength side.

For the optical filters according to Comparative Examples 4 to 7, it is conceivable to increase the content of the light absorber (copper phosphonate) in the light-absorbing layer of the optical filter by increasing the concentration of the light absorber in the light-absorbing layer or increasing the thickness of the light-absorbing layer. This may cause the IR cut-off wavelength to be shifted to the shorter-wavelength side and the UV cut-off wavelength to be shifted to the longer-wavelength side in the transmittance spectrum of the optical filter, and thus may seem to be advantageous for satisfying both of the conditions (IV) and (V). However, increasing the content of the light absorber in the light-absorbing layers of the optical filters according to Comparative Examples 4 to 7 necessarily decreases the transmittance in the visible region, making it significantly difficult to satisfy all the conditions (I) to (V) together.

According to Examples, the design parameter ranges allowable for satisfying all the conditions (I) to (V) together are broad. Thus, the embodiment of the present invention, whose effect is supported by Examples, offers a great flexibility in designing an optical filter satisfying the conditions (I) to (V).

TABLE 1

| | Materials used and their amounts [g] | | | | | | | Molar ratio of | |
| --- | --- | --- | --- | --- | --- | --- | --- | --- | --- |
| | Phosphonic acid | | | | | | Mass ratio of content | content of | |
| | Phenyl-phosphonic acid | 4-Bromophenyl-phosphonic acid | Phosphoric acid ester compound | | | Copper acetate monohydrate | of phosphonic acid to content of phosphoric acid ester compound | phosphonic acid to content of copper ion | Dispersion state of fine particles |
| | | | A208F | DDP-2 | DDP-6 | | | | |
| Example 1 | 0.4277 | 0.2747 | 1.5500 | — | — | 1.1250 | 0.453 | 0.686 | Good |
| Example 2 | 0.5848 | 0 | 2.3382 | — | — | 1.1250 | 0.250 | 0.656 | Good |

TABLE 1-continued

| | Materials used and their amounts [g] | | | | | | Molar ratio of | |
|---|---|---|---|---|---|---|---|---|
| | Phosphonic acid | | Phosphoric acid ester compound | | | | Mass ratio of content | content of |
| | Phenyl-phosphonic acid | 4-Bromophenyl-phosphonic acid | A208F | DDP-2 | DDP-6 | Copper acetate monohydrate | of phosphonic acid to content of phosphoric acid ester compound | phosphonic acid to content of copper ion | Dispersion state of fine particles |
| Example 3 | 0.5614 | 0 | 2.2446 | — | — | 1.1250 | 0.250 | 0.630 | Good |
| Example 4 | 0.6081 | 0 | 2.4311 | — | — | 1.1250 | 0.250 | 0.683 | Good |
| Example 5 | 0.6314 | 0 | 2.5245 | — | — | 1.1250 | 0.250 | 0.709 | Good |
| Example 6 | 0.6270 | 0 | 1.7930 | — | — | 1.1250 | 0.350 | 0.704 | Good |
| Example 7 | 0.6545 | 0 | 1.8705 | — | — | 1.1250 | 0.350 | 0.735 | Good |
| Example 8 | 0.5971 | 0 | 3.4100 | — | — | 1.1250 | 0.175 | 0.670 | Good |
| Example 9 | 0.5700 | 0 | 1.6300 | — | — | 1.1250 | 0.350 | 0.640 | Good |
| Example 10 | 0.6000 | 0 | 1.7156 | — | — | 1.1250 | 0.350 | 0.674 | Good |
| Example 11 | 0.5140 | 0 | 2.0568 | — | — | 1.1250 | 0.250 | 0.577 | Good |
| Example 12 | 0.5380 | 0 | 2.1510 | — | — | 1.1250 | 0.250 | 0.604 | Good |
| Example 13 | 0.4237 | 0 | 2.4200 | — | — | 1.1250 | 0.175 | 0.476 | Good |
| Example 14 | 0.4815 | 0 | 2.7500 | — | — | 1.1250 | 0.175 | 0.541 | Good |
| Example 15 | 0.6590 | 0 | 1.6275 | — | — | 1.1250 | 0.405 | 0.740 | Good |
| Example 16 | 0.5835 | 0 | — | 3.6150 | — | 1.1250 | 0.161 | 0.655 | Good |
| Example 17 | 0.5835 | 0 | — | — | 5.4750 | 1.1250 | 0.107 | 0.655 | Good |
| Example 18 | 0.8350 | 0 | 2.3375 | — | — | 1.1250 | 0.357 | 0.625 | Good |

TABLE 2

| | Average transmittance in wavelength range of 450 to 600 nm [%] | | Maximum transmittance in wavelength range of 750 to 900 nm [%] | | Average transmittance in wavelength range of 350 to 370 nm [%] | | IR cut-off wavelength [nm] | | UV cut-off wavelength [nm] | |
|---|---|---|---|---|---|---|---|---|---|---|
| Example Normalization | Condition (1) | Condition (2) | Condition (1) | Condition (2) | Condition (1) | Condition (2) | Condition (1) | Condition (2) | Condition (1) | Condition (2) |
| Example 1 | 86.3 | 85.4 | 1.0 | 0.5 | 0.4 | 0.2 | 642 | 638 | 391 | 393 |
| Example 2 | 88.3 | 87.7 | 1.0 | 0.5 | 2.7 | 1.8 | 641 | 636 | 383 | 384 |
| Example 3 | 87.9 | 87.3 | 1.0 | 0.5 | 1.9 | 1.2 | 641 | 637 | 384 | 386 |
| Example 4 | 88.3 | 87.7 | 1.0 | 0.5 | 2.7 | 1.8 | 641 | 637 | 383 | 385 |
| Example 5 | 87.9 | 87.3 | 1.0 | 0.5 | 2.5 | 1.6 | 641 | 637 | 384 | 385 |
| Example 6 | 87.9 | 87.3 | 1.0 | 0.5 | 2.0 | 1.3 | 643 | 638 | 384 | 386 |
| Example 7 | 89.5 | 89.1 | 1.0 | 0.5 | 1.5 | 0.9 | 644 | 639 | 386 | 387 |
| Example 8 | 84.8 | 83.8 | 1.0 | 0.5 | 3.9 | 2.7 | 638 | 633 | 383 | 385 |
| Example 9 | 85.7 | 84.7 | 1.0 | 0.5 | 0.2 | 0.1 | 651 | 646 | 393 | 395 |
| Example 10 | 87.4 | 86.7 | 1.0 | 0.5 | 0.6 | 0.3 | 648 | 644 | 389 | 391 |
| Example 11 | 85.7 | 84.8 | 1.0 | 0.5 | 0.4 | 0.2 | 647 | 642 | 390 | 392 |
| Example 12 | 89.1 | 88.7 | 1.0 | 0.5 | 0.8 | 0.5 | 646 | 641 | 387 | 389 |
| Example 13 | 85.1 | 84.1 | 1.0 | 0.5 | 0.6 | 0.3 | 649 | 644 | 390 | 392 |
| Example 14 | 85.7 | 84.8 | 1.0 | 0.5 | 1.8 | 1.2 | 641 | 636 | 385 | 387 |
| Example 15 | 87.9 | 87.3 | 1.0 | 0.5 | 2.2 | 1.4 | 642 | 638 | 384 | 386 |
| Example 16 | 86.2 | 85.4 | 1.0 | 0.5 | 3.8 | 2.6 | 639 | 635 | 383 | 385 |
| Example 17 | 86.3 | 85.5 | 1.0 | 0.5 | 2.9 | 2.0 | 639 | 634 | 385 | 387 |
| Example 18 | 86.9 | 86.1 | 1.0 | 0.5 | 0.3 | 0.2 | 640 | 635 | 394 | 395 |

TABLE 3

| Example | Average transmittance in wavelength range of 450 to 600 nm [%] | Maximum transmittance in wavelength range of 750 to 900 nm [%] | Average transmittance in wavelength range of 350 to 370 nm [%] | IR cut-off wavelength (nm) | UV cut-off wavelength (nm) | Thickness of light-absorbing layer [μm] |
|---|---|---|---|---|---|---|
| Example 19 | 85.0 | 0.5 | 0.2 | 638 | 394 | 258 |
| Example 20 | 87.5 | 0.4 | 1.6 | 635 | 385 | 293 |
| Example 21 | 86.2 | 0.5 | 1.3 | 637 | 386 | 285 |
| Example 22 | 82.4 | 0.5 | 0.3 | 642 | 392 | 313 |
| Example 23 | 84.6 | 0.5 | 2.5 | 635 | 385 | 286 |
| Example 24 | 85.1 | 0.4 | 1.8 | 634 | 388 | 290 |

TABLE 4

| | Materials used and their amounts [g] | | | | | | | Mass ratio of content of phosphonic acid to content of phosphoric acid ester compound | Molar ratio of content of phosphonic acid to content of copper ion | Dispersion state of fine particles |
|---|---|---|---|---|---|---|---|---|---|---|
| | Phosphonic acid | | | | | Phosphoric acid ester A208F | Copper acetate monohydrate | | | |
| | Phenyl-phosphonic acid | 4-Bromo-phenyl-phosphonic acid | n-Butyl-phosphonic acid | Hexyl-phosphonic acid | Ethyl-phosphonic acid | | | | | |
| Comparative Example 1 | 0.7795 | — | — | — | — | 1.5590 | 1.1250 | 0.500 | 0.875 | Aggregated |
| Comparative Example 2 | 0.6174 | — | — | — | — | 1.2348 | 1.1250 | 0.500 | 0.693 | Aggregated |
| Comparative Example 3 | — | 1.1310 | — | — | — | 1.5085 | 1.1250 | 0.750 | 0.847 | Aggregated |
| Comparative Example 4 | — | — | 0.6700 | — | — | 0.8910 | 1.1250 | 0.752 | 0.861 | Good |
| Comparative Example 5 | — | — | — | 0.7275 | — | 1.2110 | 1.1250 | 0.601 | 0.777 | Good |
| Comparative Example 6 | — | — | — | 0.8257 | — | 1.3745 | 1.1250 | 0.601 | 0.882 | Good |
| Comparative Example 7 | — | — | — | — | 0.4811 | 1.2105 | 1.1250 | 0.397 | 0.776 | Good |

TABLE 5

| Comparative Example Normalization | Average transmittance in wavelength range of 450 to 600 nm [%] | | Maximum transmittance in wavelength range of 750 to 900 nm [%] | | Average transmittance in wavelength range of 350 to 370 nm [%] | | IR cut-off wavelength [nm] | | UV cut-off wavelength [nm] | |
|---|---|---|---|---|---|---|---|---|---|---|
| | Condition (1) | Condition (2) | Condition (1) | Condition (2) | Condition (1) | Condition (2) | Condition (1) | Condition (2) | Condition (1) | Condition (2) |
| Comparative Example 4 | 86.8 | 86.1 | 1.0 | 0.5 | 42.9 | 38.6 | 676 | 672 | 362 | 364 |
| Comparative Example 5 | 86.2 | 85.4 | 1.0 | 0.5 | 43.1 | 38.8 | 671 | 666 | 362 | 364 |
| Comparative Example 6 | 86.2 | 85.4 | 1.0 | 0.5 | 42.5 | 38.2 | 674 | 670 | 362 | 364 |
| Comparative Example 7 | 87.2 | 86.5 | 1.0 | 0.5 | 48.7 | 44.5 | 678 | 675 | 360 | 362 |

The invention claimed is:

1. A light-absorbing composition comprising:
a light absorber formed by a phosphonic acid represented by the following formula (a) and copper ion, the light absorber being dispersed in the light-absorbing composition:

(a)

wherein $R_{11}$ is a phenyl group or a halogenated phenyl group in which at least one hydrogen atom of a phenyl group is substituted by a halogen atom;
a phosphoric acid ester allowing the light absorber to be dispersed; and
a curable resin, wherein
a laminate satisfies the following requirements (i) to (v), the laminate consisting of a light-absorbing layer that is a cured product of the light-absorbing composition and a transparent dielectric substrate:

(i) the laminate has an average spectral transmittance of 80% or more in a wavelength range of 450 nm to 600 nm;
(ii) the laminate has a spectral transmittance of 1% or less in a wavelength range of 750 nm to 900 nm;
(iii) the laminate has an average spectral transmittance of 4% or less in a wavelength range of 350 nm to 370 nm;
(iv) the laminate has a decreasing spectral transmittance with increasing wavelength in a wavelength range of 600 nm to 800 nm and, when a wavelength which lies in the wavelength range of 600 nm to 800 nm and at which the spectral transmittance of the laminate is 50% is defined as an infrared cut-off wavelength, the infrared cut-off wavelength for light incident on the laminate at an incident angle of 0° is in a range of 620 nm to 680 nm; and
(v) the laminate has an increasing spectral transmittance with increasing wavelength in a wavelength range of 350 nm to 450 nm and, when a wavelength which lies in the wavelength range of 350 nm to 450 nm and at which the spectral transmittance of the laminate is 50% is defined as an ultraviolet cut-off wavelength, the ultraviolet cut-off wavelength for light incident on the laminate at an incident angle of 0° is in a range of 380 nm to 420 nm.

2. The light-absorbing composition according to claim 1, wherein the ratio of the content of the phosphonic acid to the content of the phosphoric acid ester is 0.10 to 0.48 on a mass basis, and the ratio of the content of the phosphonic acid to the content of the copper ion is 0.45 to 0.80 on an amount-of-substance basis.

3. The light-absorbing composition according to claim 1, further comprising an auxiliary light absorber formed by a phosphonic acid represented by the following formula (b) and copper ion:

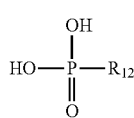
(b)

wherein $R_{12}$ is an alkyl group having 6 or less carbon atoms.

4. An optical filter comprising:
a transparent dielectric substrate having an average spectral transmittance of 90% or more in a wavelength range of 450 nm to 600 nm; and
a light-absorbing layer formed by a cured product of a light-absorbing composition to have a thickness of 30 μm to 800 μm and disposed parallel to one principal surface of the transparent dielectric substrate, the light-absorbing composition comprising: a light absorber formed by a phosphonic acid represented by the following formula (a) and copper ion; a phosphoric acid ester allowing the light absorber to be dispersed; and a curable resin, the light absorber being dispersed in the light-absorbing composition:

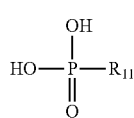
(a)

wherein $R_{11}$ is a phenyl group or a halogenated phenyl group in which at least one hydrogen atom of a phenyl group is substituted by a halogen atom,
wherein
(I) the optical filter has an average spectral transmittance of 80% or more in a wavelength range of 450 nm to 600 nm,
(II) the optical filter has a spectral transmittance of 1% or less in a wavelength range of 750 nm to 900 nm,
(III) the optical filter has an average spectral transmittance of 4% or less in a wavelength range of 350 nm to 370 nm,
(IV) the optical filter has a decreasing spectral transmittance with increasing wavelength in a wavelength range of 600 nm to 800 nm and, when a wavelength which lies in the wavelength range of 600 nm to 800 nm and at which the spectral transmittance of the optical filter is 50% is defined as an infrared cut-off wavelength, the infrared cut-off wavelength for light incident on the optical filter at an incident angle of 0° is in a range of 620 nm to 680 nm, and
(V) the optical filter has an increasing spectral transmittance with increasing wavelength in a wavelength range of 350 nm to 450 nm and, when a wavelength which lies in the wavelength range of 350 nm to 450 nm and at which the spectral transmittance of the optical filter is 50% is defined as an ultraviolet cut-off wavelength, the ultraviolet cut-off wavelength for light incident on the optical filter at an incident angle of 0° is in a range of 380 nm to 420 nm.

5. The optical filter according to claim 4, wherein in the light-absorbing layer, the ratio of the content of the phosphonic acid to the content of the phosphoric acid ester is 0.10 to 0.48 on a mass basis, and the ratio of the content of the phosphonic acid to the content of the copper ion is 0.45 to 0.80 on an amount-of-substance basis.

6. The optical filter according to claim 4, wherein the light-absorbing layer further comprises an auxiliary light absorber formed by a phosphonic acid represented by the following formula (b) and copper ion:

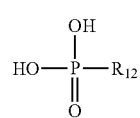
(b)

wherein $R_{12}$ is an alkyl group having 6 or less carbon atoms.

7. The optical filter according to claim 4, wherein the light-absorbing layer has a thickness of 30 μm to 800 μm.

8. The optical filter according to claim 4, further comprising an infrared-reflecting film formed by alternating layers of different materials having different refractive indices.

9. The optical filter according to claim 4, further comprising an auxiliary light-absorbing layer formed by a cured product of an auxiliary light-absorbing composition and disposed parallel to one principal surface of the transparent dielectric substrate, the auxiliary light-absorbing composition comprising: an auxiliary light absorber formed by a phosphonic acid represented by the following formula (b) and copper ion; a phosphoric acid ester allowing the auxiliary light absorber to be dispersed; and a curable resin:

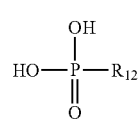
(b)

wherein $R_{12}$ is an alkyl group having 6 or less carbon atoms.

* * * * *